US010191682B2

(12) United States Patent
Heddes et al.

(10) Patent No.: US 10,191,682 B2
(45) Date of Patent: Jan. 29, 2019

(54) PROVIDING EFFICIENT LOSSLESS COMPRESSION FOR SMALL DATA BLOCKS IN PROCESSOR-BASED SYSTEMS

(71) Applicant: QUALCOMM Incorporated, San Diego, CA (US)

(72) Inventors: Mattheus Cornelius Antonius Adrianus Heddes, Raleigh, NC (US); Perry Willmann Remaklus, Jr., Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 159 days.

(21) Appl. No.: 15/259,686

(22) Filed: Sep. 8, 2016

(65) Prior Publication Data

US 2018/0067679 A1  Mar. 8, 2018

(51) Int. Cl.
*H03M 7/00* (2006.01)
*H03M 7/34* (2006.01)
(Continued)

(52) U.S. Cl.
CPC .......... *G06F 3/0638* (2013.01); *G06F 3/0626* (2013.01); *G06F 3/0673* (2013.01);
(Continued)

(58) Field of Classification Search
CPC .. G06F 3/0638; G06F 13/1668; G06F 3/0626; G06F 12/0897; G06F 3/0673;
(Continued)

(56) References Cited

U.S. PATENT DOCUMENTS 6,072,830 A * 6/2000 Proctor ................... G06T 9/008
375/240.22
6,195,391 B1 * 2/2001 Hancock ................ H04N 19/00
375/240
(Continued)

FOREIGN PATENT DOCUMENTS

WO    2015179606 A1    11/2015

OTHER PUBLICATIONS

Author Unknown, "Data Compression/Dictionary compression," Wikibooks, last edited Jul. 11, 2016, 20 pages, Retrieved from the Internet: URL:https://en.wikibooks.org/wiki/Data_Compression/Dictionary_compression.
(Continued)

*Primary Examiner* — Jean B Jeanglaude
(74) *Attorney, Agent, or Firm* — Withrow & Terranova, PLLC

(57) ABSTRACT

Providing efficient lossless compression for small data blocks in processor-based systems is provided. In one aspect, a method comprises receiving a plurality of input words. Each mask of a plurality of masks is applied to each unassigned input word to generate a corresponding plurality of patterns. For each mask, if a most frequently occurring pattern exists among the plurality of patterns, the most frequently occurring pattern and an uncompressed data portion of each unassigned input word are stored in association with a prefix associated with the mask. The prefix is also assigned to each unassigned input word corresponding to the most frequently occurring pattern. A compressed output block is generated, comprising prefixes assigned to the plurality of input words, the most frequently occurring patterns associated with the assigned prefixes, and uncompressed data portions corresponding to one or more input words of the plurality of input words.

28 Claims, 17 Drawing Sheets

(51) Int. Cl.
*H03M 7/30* (2006.01)
*G06F 3/06* (2006.01)
*G06F 12/0897* (2016.01)
*G06F 13/16* (2006.01)

(52) U.S. Cl.
CPC ...... *G06F 12/0897* (2013.01); *G06F 13/1668* (2013.01); *H03M 7/3066* (2013.01); *H03M 7/3086* (2013.01); *H03M 7/70* (2013.01); *G06F 3/0613* (2013.01); *G06F 2212/60* (2013.01)

(58) Field of Classification Search
CPC ...... G06F 2212/60; G06F 3/0613; G06F 3/06; G06F 12/08; H03M 7/70; H03M 7/3086; H03M 7/3066; H03M 7/30
USPC ............ 341/55, 50, 51, 87; 375/240, 240.22
See application file for complete search history.

(56) References Cited

U.S. PATENT DOCUMENTS

| | | | |
|---|---|---|---|
| 6,898,311 B2 | 5/2005 | Whitehead | |
| 7,190,284 B1 | 3/2007 | Dye et al. | |
| 7,705,753 B2 | 4/2010 | Speirs, III et al. | |
| 7,907,069 B2 * | 3/2011 | Oberdorfer | H03M 7/30 341/55 |
| 8,497,788 B1 | 7/2013 | Miller et al. | |
| 8,990,217 B2 * | 3/2015 | Jagmohan | H03M 7/3084 367/14 |
| 2010/0223237 A1 | 9/2010 | Mishra et al. | |
| 2015/0339228 A1 | 11/2015 | Heddes et al. | |

OTHER PUBLICATIONS

Chen, Xi et al., "C-Pack: A High-Performance Microprocessor Cache Compression Algorithm," IEEE Transactions on Very Large Scale Integration (VLSI) Systems, vol. 18, No. 8, Aug. 2010, pp. 1196-1208.

Seong, Seok-Won et al., "An Efficient Code Compression Technique using Application Aware Bitmask and Dictionary Selection Methods," Design, Automation & Test in Europe Conference & Exhibition, Nice, France, Apr. 1, 2007, 6 pages.

International Search Report and Written Opinion for PCT/US20171045276, dated Oct. 23, 2017, 20 pages.

Second Written Opinion for PCT/US2017/045276, dated Jul. 27, 2018, 6 pages.

* cited by examiner

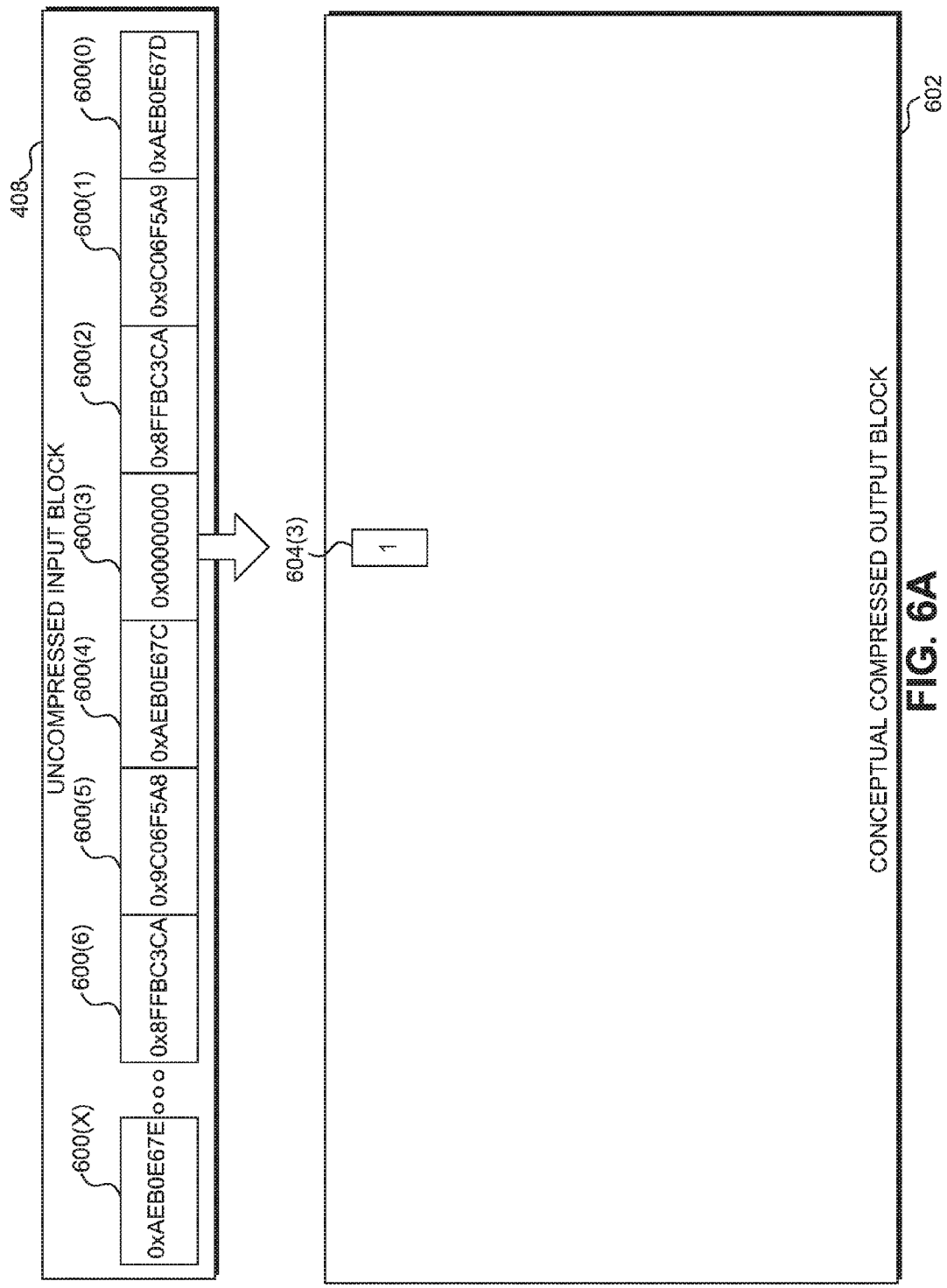

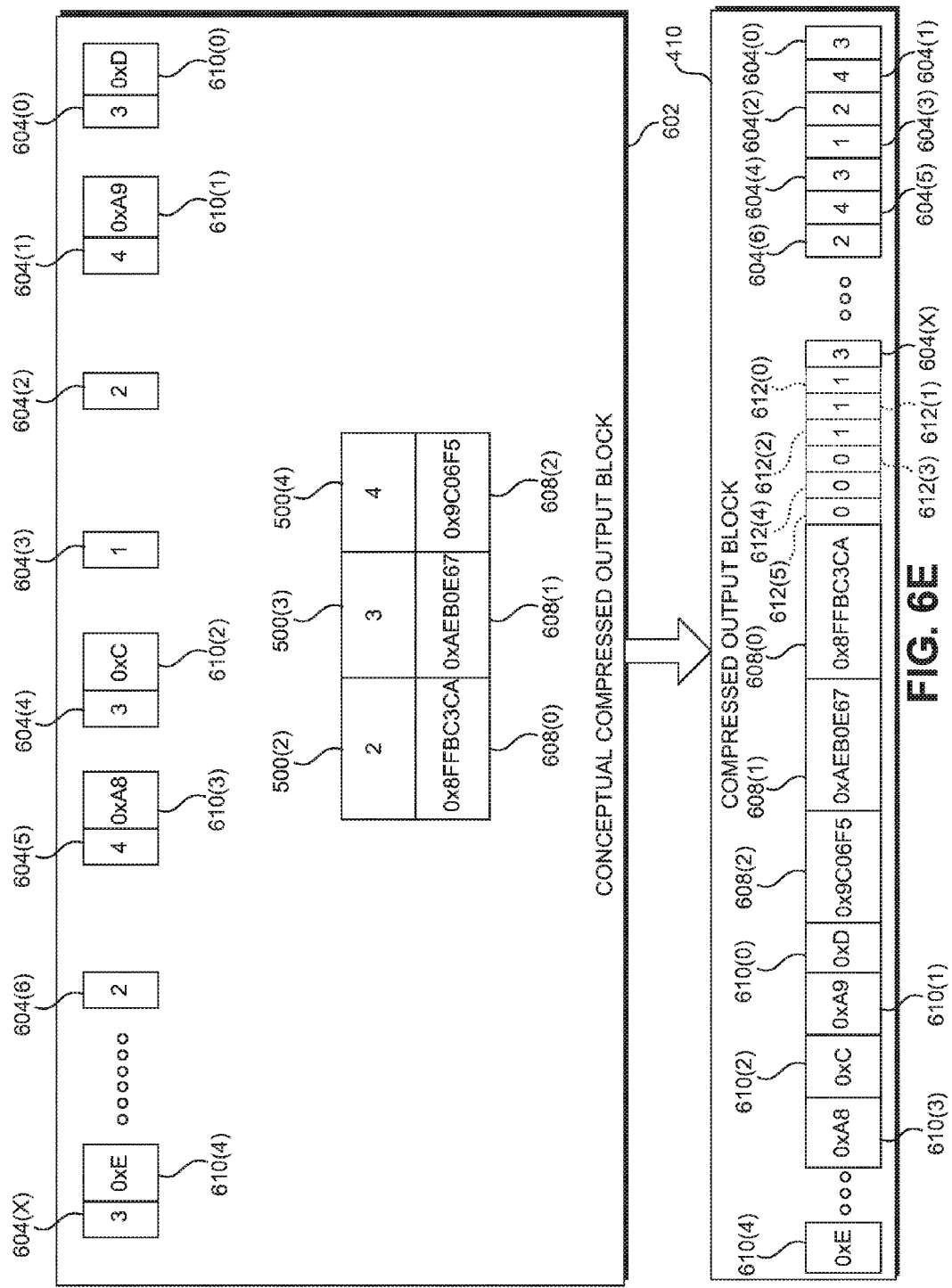

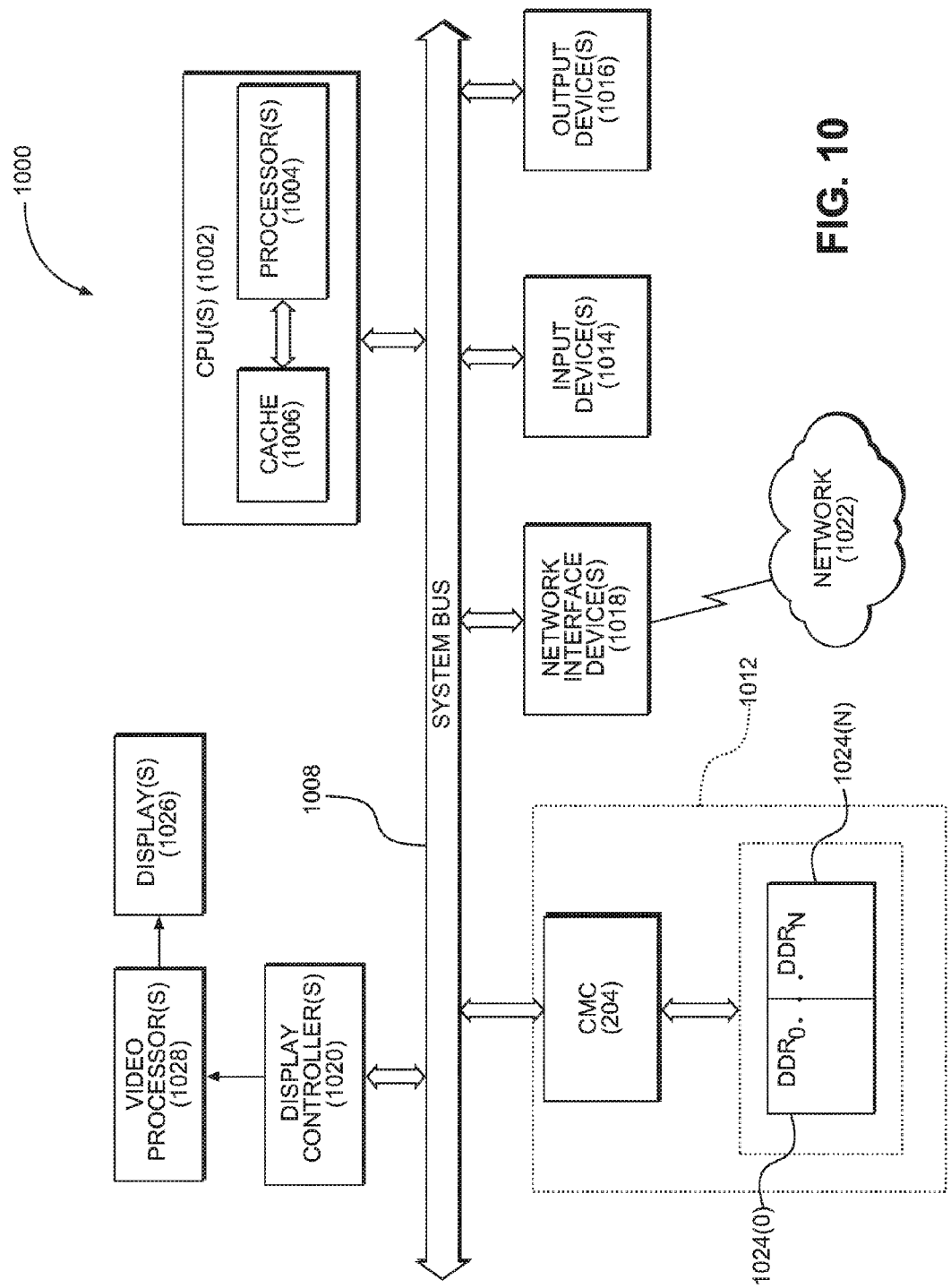

PROVIDING EFFICIENT LOSSLESS COMPRESSION FOR SMALL DATA BLOCKS IN PROCESSOR-BASED SYSTEMS

BACKGROUND

I. Field of the Disclosure

The technology of the disclosure relates generally to lossless compression operations, and in particular to providing lossless compression for cache lines and other relatively small blocks of memory in processor-based systems.

II. Background

Lossless data compression techniques (i.e., techniques for data compression that allow original data to be perfectly reconstructed from compressed data) have the potential to prove useful for addressing a variety of computer processor performance and architectural issues. As non-limiting examples, lossless data compression may provide a mechanism for improving memory bandwidth, increasing effective memory capacity, and/or reducing last-level cache (LLC) sizes. To achieve these benefits, the particular lossless data compression mechanism that is implemented should be able to efficiently compress relatively small data blocks, such as data blocks the size of conventional cache lines (e.g., data blocks of 128 bytes, in some aspects).

However, most conventional lossless compression methods such as ZIP compression are designed to operate on relatively larger data blocks (e.g., data blocks of one (1) kilobyte (KB) or larger). Moreover, conventional solutions for small block compression either have a number of associated drawbacks, or are of unknown effectiveness. For instance, the Smaz and Base-Delta-Immediate compression mechanisms may not achieve acceptable results when compressing small data blocks, while the FPC (Frequent Pattern Compression) mechanism is based on compressing primarily zero (0) values within a data block. A recently developed compression mechanism known as the Cache Packer (C-Pack) method is similar to ZIP compression and reportedly is optimized for small blocks. However, C-Pack is relatively complex to implement, and its overall effectiveness is not well known.

Accordingly, to provide efficient compression of small data blocks such as cache lines, a relatively simpler lossless compression mechanism is desirable.

SUMMARY OF THE DISCLOSURE

Aspects disclosed in the detailed description include providing efficient lossless compression for small data blocks in processor-based systems. In this regard, in some aspects, a compressed memory controller for detecting and encoding patterns within relatively small data blocks is provided. The compressed memory controller provides a mask table that stores a plurality of masks, each associated with a prefix. The compressed memory controller also includes a pattern identification circuit and an output generation circuit.

The pattern identification circuit first receives an input data block comprising a plurality of input words to be compressed. In an exemplary aspect, the input data block may comprise a 128-byte line comprising 32 input words of 32 bits each. The pattern identification circuit then iterates through the masks in the mask table and, during each iteration, applies a mask to the input words to generate a plurality of patterns (i.e., the non-masked portions of the input words). If a pattern among the generated patterns is identified as a most frequently occurring pattern, that pattern and an uncompressed data portion of each corresponding input word (i.e., the portion of the input word that was masked off to generate the pattern), if any, are output to the output generation circuit in association with the prefix associated with the mask. Each input word corresponding to the most frequently occurring pattern is assigned the prefix corresponding to the mask, and the pattern identification circuit applies the next mask to the remaining unassigned input words.

The pattern identification circuit outputs the prefixes that were assigned to each of the input words to the output generation circuit. The output generation circuit then generates a compressed output block that includes, for each input word, an assigned prefix, and also includes one or more frequently occurring patterns each associated with an assigned prefix, and one or more uncompressed data portions of one or more corresponding input words.

In some aspects, the mask table may also include a prefix indicating a zero (0) value. Before beginning the iterations through the masks of the mask table, the pattern identification circuit may first determine whether any input words have a value of zero (0). If so, the pattern identification circuit may assign the prefix indicating a zero (0) value to the input words having a value of zero (0). Some aspects may provide that, after completing the iterations through the masks of the mask table, the pattern identification circuit may determine whether any unassigned input words remain among the plurality of input words. If so, the pattern identification circuit may output a value of each unassigned input word to the output generation circuit as an uncompressed data portion of the unassigned input word in association with a prefix indicating an uncompressed input word. According to some aspects, the output generation circuit may generate the compressed output block further including a set of flags, one for each prefix in the mask table, indicating which of the prefixes was assigned to an input word during compression.

In another aspect, a compressed memory controller (CMC) is provided. The CMC comprises a mask table that provides a plurality of masks and an associated plurality of prefixes. The CMC further comprises a pattern identification circuit. The pattern identification circuit is configured to receive a plurality of input words. The pattern identification circuit is further configured to, for each mask of the plurality of masks of the mask table, apply the mask to each unassigned input word of the plurality of input words to generate a corresponding plurality of patterns. The pattern identification circuit is also configured to determine whether a most frequently occurring pattern exists among the plurality of patterns. The pattern identification circuit is additionally configured to, responsive to determining that a most frequently occurring pattern exists among the plurality of patterns, output the most frequently occurring pattern and an uncompressed data portion of each unassigned input word to an output generation circuit in association with a prefix of the plurality of prefixes associated with the mask. The pattern identification circuit is further configured to assign the prefix associated with the mask to each unassigned input word corresponding to the most frequently occurring pattern. The pattern identification circuit is also configured to output a plurality of assigned prefixes assigned to the plurality of input words to the output generation circuit. The output generation circuit is configured to generate a compressed output block. The compressed output block comprises the plurality of assigned prefixes assigned to the plurality of input words. The compressed output block further comprises one or more most frequently occurring patterns, each associated with one of the plurality of assigned prefixes. The compressed output block also comprises one or more uncompressed data portions of a corresponding one or more input words of the plurality of input words.

In another aspect, a CMC is provided. The CMC comprises a means for receiving a plurality of input words. The CMC further comprises a means, for each mask of a plurality of masks, for applying the mask to each unassigned input word of the plurality of input words to generate a corresponding plurality of patterns. The CMC also comprises a means for determining whether a most frequently occurring pattern exists among the plurality of patterns. The CMC additionally comprises a means for storing the most frequently occurring pattern and an uncompressed data portion of each unassigned input word in association with a prefix associated with the mask, responsive to determining that a most frequently occurring pattern exists among the plurality of patterns. The CMC further comprises a means for assigning the prefix associated with the mask to each unassigned input word corresponding to the most frequently occurring pattern, responsive to determining that a most frequently occurring pattern exists among the plurality of patterns. The CMC also comprises a means for generating a compressed output block comprising a plurality of assigned prefixes assigned to the plurality of input words, one or more most frequently occurring patterns each associated with one of the plurality of assigned prefixes, and one or more uncompressed data portions of a corresponding one or more input words of the plurality of input words.

In another aspect, a method for providing efficient lossless compression of data blocks is provided. The method comprises receiving a plurality of input words. The method further comprises, for each mask of a plurality of masks, applying the mask to each unassigned input word of the plurality of input words to generate a corresponding plurality of patterns. The method also comprises determining whether a most frequently occurring pattern exists among the plurality of patterns. The method additionally comprises, responsive to determining that a most frequently occurring pattern exists among the plurality of patterns, storing the most frequently occurring pattern and an uncompressed data portion of each unassigned input word in association with a prefix associated with the mask. The method further comprises assigning the prefix associated with the mask to each unassigned input word corresponding to the most frequently occurring pattern. The method also comprises generating a compressed output block comprising a plurality of assigned prefixes assigned to the plurality of input words, one or more most frequently occurring patterns each associated with one of the plurality of assigned prefixes, and one or more uncompressed data portions of one or more corresponding input words of the plurality of input words.

In another aspect, a non-transitory computer-readable medium is provided, having stored thereon computer-executable instructions. When executed by a processor, the computer-executable instructions cause the processor to receive a plurality of input words. The computer-executable instructions further cause the processor to, for each mask of a plurality of masks, apply the mask to each unassigned input word of the plurality of input words to generate a corresponding plurality of patterns. The computer-executable instructions also cause the processor to determine whether a most frequently occurring pattern exists among the plurality of patterns. The computer-executable instructions additionally cause the processor to, responsive to determining that a most frequently occurring pattern exists among the plurality of patterns, store the most frequently occurring pattern and an uncompressed data portion of each unassigned input word in association with a prefix associated with the mask. The computer-executable instructions further cause the processor to assign the prefix associated with the mask to each unassigned input word corresponding to the most frequently occurring pattern. The computer-executable instructions further cause the processor to generate a compressed output block comprising a plurality of assigned prefixes assigned to the plurality of input words, one or more most frequently occurring patterns, each associated with one of the plurality of assigned prefixes, and one or more uncompressed data portions of a corresponding one or more input words of the plurality of input words.

BRIEF DESCRIPTION OF THE FIGURES

FIGS. 6A-6E are diagrams illustrating exemplary operations of the CMC of FIGS. 2, 3, and 4 for compressing input data words and generating a compressed output block;

FIG. 10 is a block diagram of an exemplary processor-based system that can include the CMC of FIGS. 2, 3, and 4.

DETAILED DESCRIPTION

Figure 1:
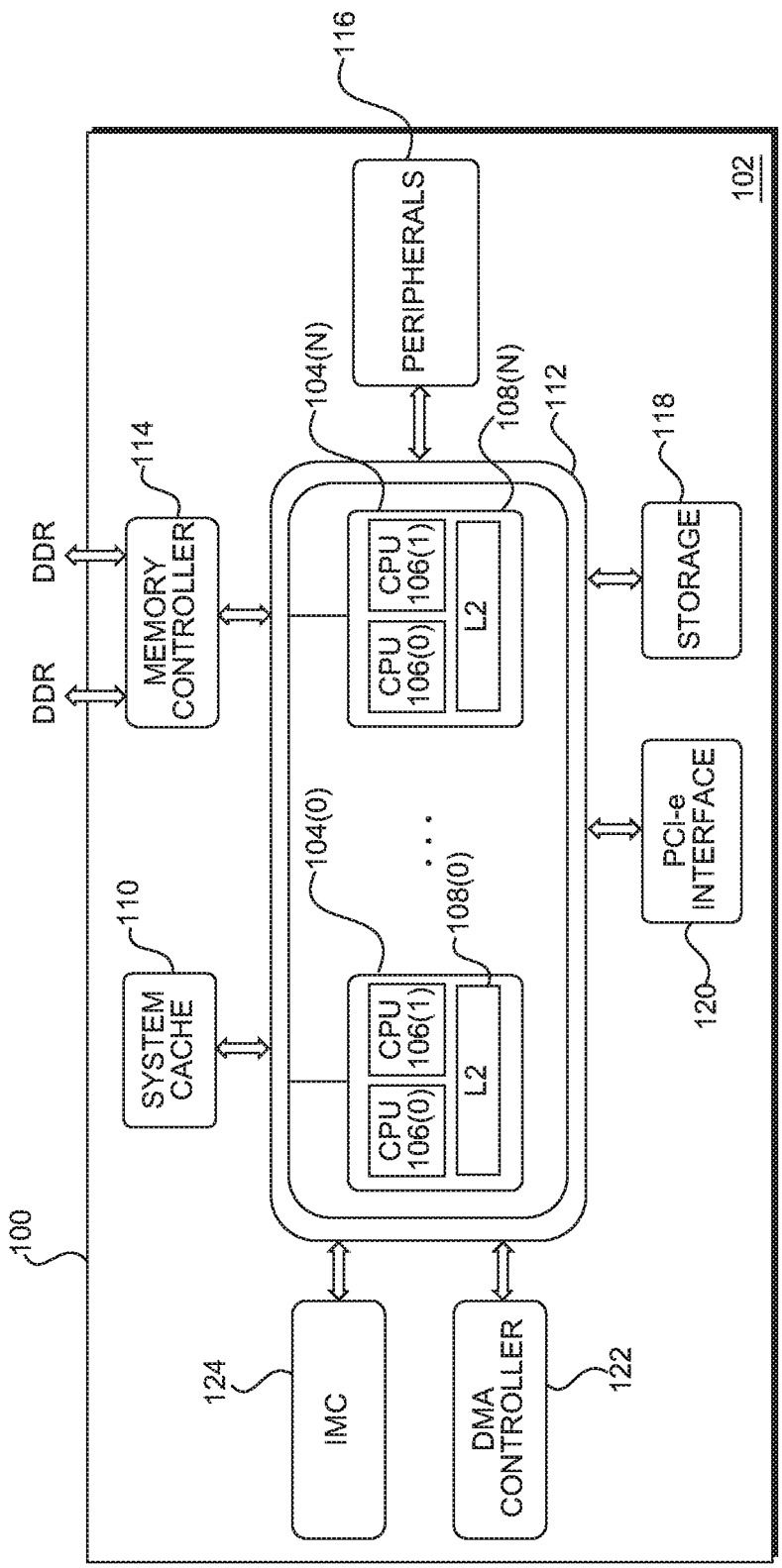
FIG. 1 is a schematic diagram of an exemplary system-on-a-chip (SoC) that includes a processor-based system.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include providing efficient lossless compression for small data blocks in processor-based systems. In this regard, in some aspects, a compressed memory controller for detecting and encoding patterns within relatively small data blocks is provided. The compressed memory controller provides a mask table that stores a plurality of masks, each associated with a prefix. The compressed memory controller also includes a pattern identification circuit and an output generation circuit.

The pattern identification circuit first receives an input data block comprising a plurality of input words to be compressed. In an exemplary aspect, the input data block may comprise a 128-byte line comprising 32 input words of 32 bits each. The pattern identification circuit then iterates through the masks in the mask table and, during each iteration, applies a mask to the input words to generate a plurality of patterns (i.e., the non-masked portions of the input words). If a pattern among the generated patterns is identified as a most frequently occurring pattern, that pattern and an uncompressed data portion of each corresponding input word (i.e., the portion of the input word that was masked off to generate the pattern), if any, are output to the output generation circuit in association with the prefix associated with the mask. Each input word corresponding to the most frequently occurring pattern is assigned the prefix corresponding to the mask, and the pattern identification circuit applies the next mask to the remaining unassigned input words.

The pattern identification circuit outputs the prefixes that were assigned to each of the input words to the output generation circuit. The output generation circuit then generates a compressed output block that includes, for each input word, an assigned prefix, and also includes one or more frequently occurring patterns each associated with an assigned prefix, and one or more uncompressed data portions of one or more corresponding input words.

Figure 2:
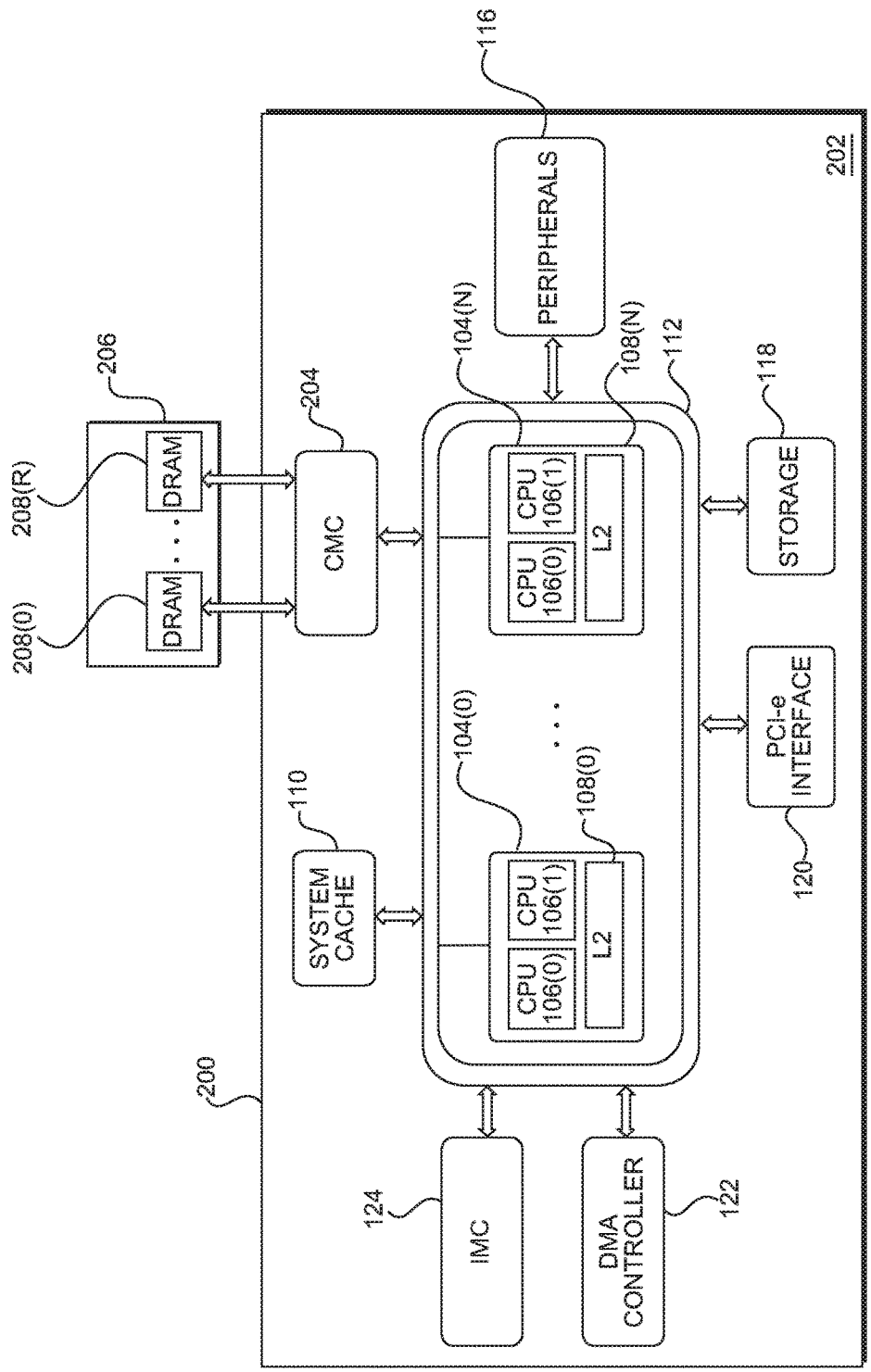
FIG. 2 is a schematic diagram of an SoC that includes an exemplary processor-based system having a plurality of central processing units (CPUs) and a compressed memory controller (CMC) configured to provide memory bandwidth compression.
Figure 3:
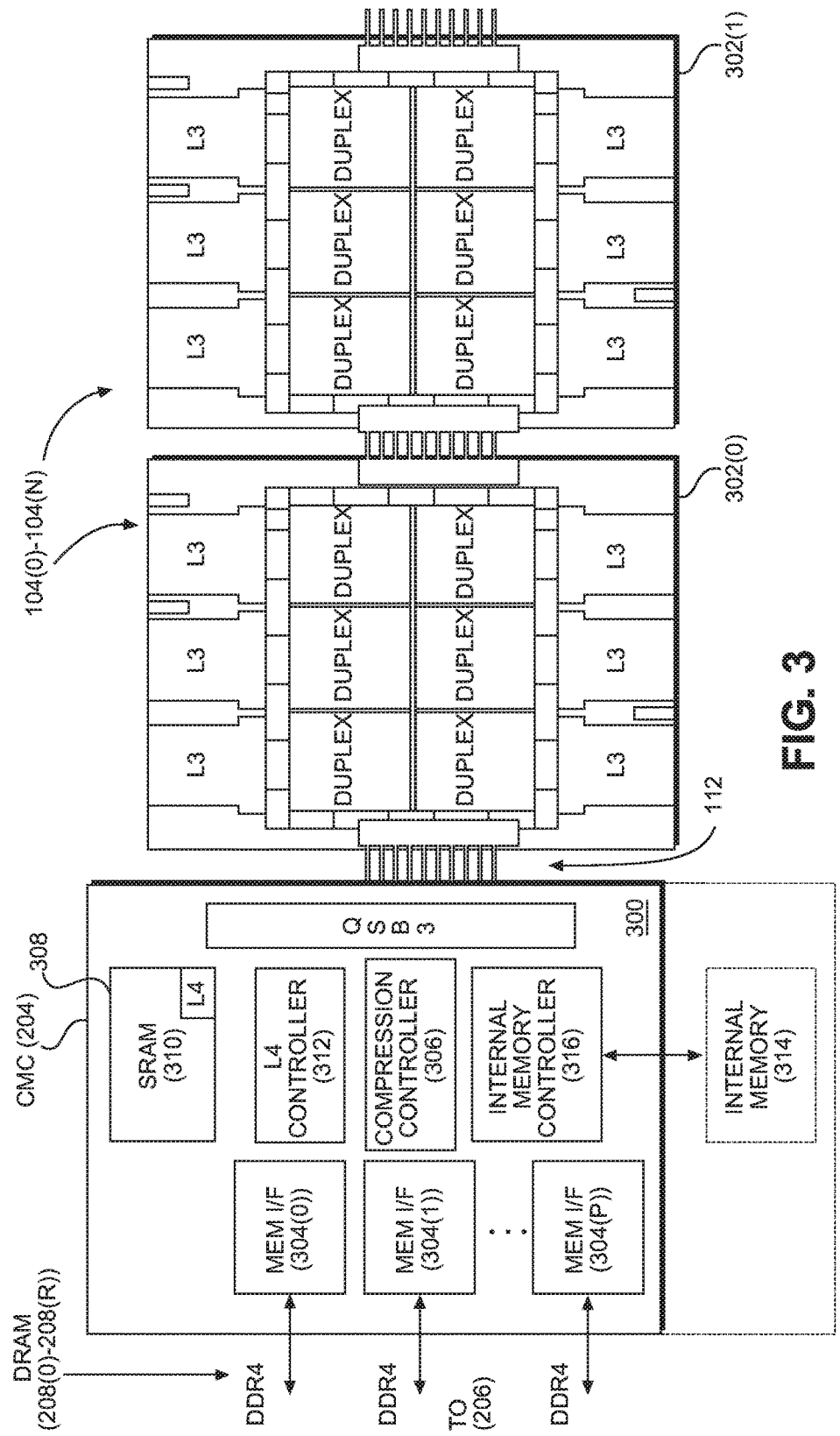
FIG. 3 is a more detailed schematic diagram of the CMC of FIG. 2, wherein the CMC is further communicatively coupled to an optional, internal memory that may be employed to provide memory bandwidth compression.

Before discussing operations for providing efficient lossless compression for small data blocks in greater detail, an exemplary processor-based system and elements thereof are described with respect to FIGS. 1-3. In this regard, FIG. 1 is a schematic diagram of an exemplary system-on-a-chip (SoC) 100 that includes a processor-based system 102. The processor-based system 102 includes a plurality of central processing unit (CPU) blocks 104(0)-104(N) in this example, wherein 'N' is equal to any number of CPU blocks 104(0)-104(N) desired. In the example of FIG. 1, each of the CPU blocks 104(0)-104(N) contains two (2) CPUs 106(0), 106(1). The CPU blocks 104(0)-104(N) further contain shared Level 2 (L2) caches 108(0)-108(N), respectively. A system cache 110 (e.g., a Level 3 (L3) cache) is also provided for storing cached data that is used by any of, or shared among, each of the CPU blocks 104(0)-104(N). An internal system bus 112 is provided to enable each of the CPU blocks 104(0)-104(N) to access the system cache 110 as well as other shared resources. Other shared resources accessed by the CPU blocks 104(0)-104(N) through the internal system bus 112 may include a memory controller 114 for accessing a main, external memory (e.g., double-rate dynamic random access memory (DRAM) (DDR), as a non-limiting example), peripherals 116, other storage 118, an express peripheral component interconnect (PCI-e) interface 120, a direct memory access (DMA) controller 122, and/or an integrated memory controller (IMC) 124.

As processor-based applications executing in the processor-based system 102 in FIG. 1 increase in complexity and performance, limitations on memory bandwidth may impose constraints on the processor-based system 102. If accesses to external memory reach memory bandwidth limits, the memory controller 114 of the processor-based system 102 may be forced to queue memory access requests. Such queueing of memory access requests may increase the latency of memory accesses, which in turn may decrease the performance of the processor-based system 102.

To address these issues, some aspects of the processor-based system 102 may provide a compressed memory controller (CMC) that is configured to provide compression for data to be written to memory arrays such the L2 caches 108(0)-108(N), the system cache 110, and/or a system memory. In this regard, FIG. 2 is a schematic diagram of an SoC 200 that includes a processor-based system 202 having a plurality of CPU blocks 104(0)-104(N) similar to the processor-based system 102 in FIG. 1. The processor-based system 202 in FIG. 2 includes some common components with the processor-based system 102 in FIG. 1, which are noted by common element numbers between FIGS. 1 and 2. For the sake of brevity, these elements will not be re-described. However, in the processor-based system 202 in FIG. 2, a CMC 204 is provided. The CMC 204 controls access to a system memory 206. The system memory 206 may comprise one or more DDR DRAMs 208(0)-208(R) (referred to hereinafter as "DRAM 208(0)-208(R)"), as a non-limiting example. The CMC 204 in this example employs memory bandwidth compression according to the aspects disclosed herein and below. Similar to the memory controller 114 of the processor-based system 102 of FIG. 1, the CMC 204 in the processor-based system 202 in FIG. 2 is shared by the CPU blocks 104(0)-104(N) through the internal system bus 112.

The processor-based system 202 of FIG. 2 may encompass any one of known digital logic elements, semiconductor circuits, processing cores, and/or memory structures, among other elements, or combinations thereof. Aspects described herein are not restricted to any particular arrangement of elements, and the disclosed techniques may be easily extended to various structures and layouts on semiconductor dies or packages. It is to be understood that some aspects of the processor-based system 202 may include elements in addition to those illustrated in FIG. 2.

A more detailed schematic diagram of exemplary internal components of the CMC 204 in FIG. 2 is provided in FIG. 3. In this example, the CMC 204 is provided on a separate semiconductor die 300 from semiconductor dies 302(0), 302(1) that contain the CPU blocks 104(0)-104(N) in FIG. 2. Alternatively, in some aspects the CMC 204 may be included in a common semiconductor die (not shown) with the CPU blocks 104(0)-104(N). Regardless of the die configurations, the CMC 204 is provided such that the CPU blocks 104(0)-104(N) may make memory access requests via the internal system bus 112 to the CMC 204, and receive data from memory through the CMC 204.

With continuing reference to FIG. 3, the CMC 204 controls operations for memory accesses to the system memory 206, which is shown in FIGS. 2 and 3 as comprising DRAM 208(0)-208(R). The CMC 204 includes a plurality of memory interfaces (MEM I/Fs) 304(0)-304(P) (e.g., DDR DRAM interfaces) used to service memory access requests. In this regard, the CMC 204 in this example includes a compression controller 306. The compression controller 306 controls the compression of data stored to the system memory 206 and the decompression of data retrieved from the system memory 206 in response to memory access requests from the CPU blocks 104(0)-104(N). The compression controller 306 can also be configured to perform bandwidth compression of information provided over the internal system bus 112 to the CPU blocks 104(0)-104(N).

A local memory 308 is provided for data structures and other information needed by the compression controller 306 to perform compression techniques and algorithms. In this regard, the local memory 308 is provided in the form of a static random access memory (SRAM) 310. The local memory 308 is of sufficient size to be used for data structures and other data storage that may be needed for the compression controller 306 to perform compression techniques and algorithms. The local memory 308 may also be partitioned to contain a cache, such as a Level 4 (L4) cache, to provide additional cache memory for internal use within the CMC 204. Thus, an L4 controller 312 may also be provided in the CMC 204 to provide access to the L4 cache. Enhanced compression techniques and algorithms may require a larger internal memory. For example, the local memory 308 may provide 128 kilobytes (kB) of memory.

Further, as shown in FIG. 3, an optional, additional internal memory 314 can also be provided for the CMC 204. The additional internal memory 314 may be provided as DRAM, as an example. The additional internal memory 314 can facilitate additional or greater amounts of storage of data structures and other data than in the local memory 308 for the CMC 204 providing memory bandwidth compression and decompression mechanisms to increase the memory bandwidth compression of the processor-based system 202. Some aspects may provide an internal memory controller 316 in the CMC 204 to control memory accesses to the additional internal memory 314 for use in compression. In such aspects, the internal memory controller 316 is not accessible or viewable to the CPU blocks 104(0)-104(N).

Each of the resources provided in the CMC 204 in FIG. 3, including the local memory 308 and the additional internal memory 314, can be used individually or in conjunction with each other to achieve the desired balance among resources and area, power consumption, increased memory capacity, and increased performance. Further, the resources described above for use by the CMC 204 can be enabled or disabled to achieve the desired tradeoffs among efficiency, power consumption, and performance.

Figure 4:
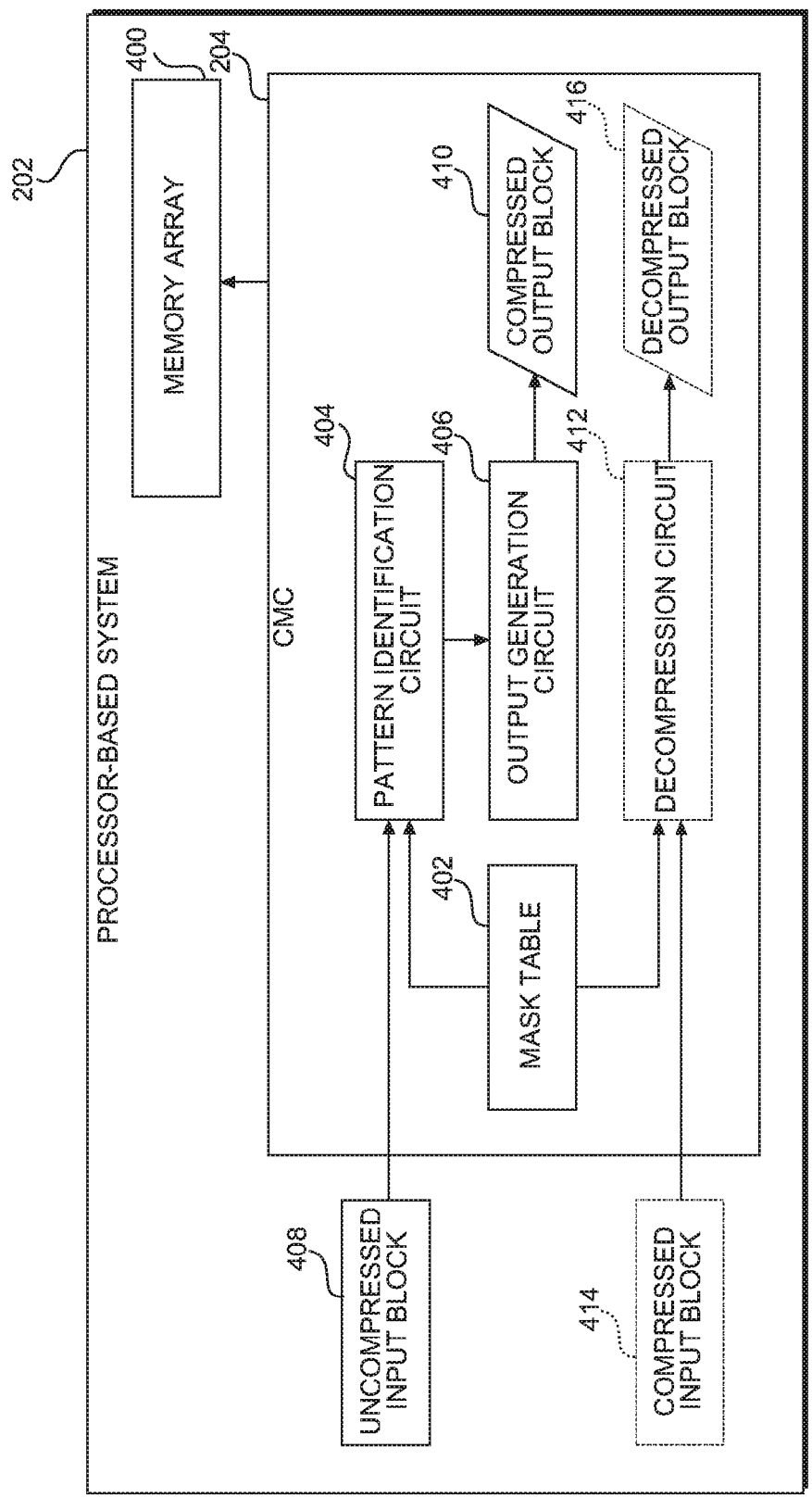
FIG. 4 is a diagram illustrating exemplary elements of the CMC of FIGS. 2 and 3 for providing efficient lossless compression of cache lines and other relatively small data blocks.

To illustrate exemplary elements of the CMC 204 of FIGS. 2 and 3 for providing efficient lossless compression of small data blocks, FIG. 4 is provided. As seen in FIG. 4, the processor-based system 202 includes the CMC 204 and a memory array 400. In some aspects, the memory array 400 may comprise caches such as the L2 caches 108(0)-108(N) and/or the system cache 110 of FIG. 1, the system memory 206 of FIG. 2, and/or the local memory 308 and/or the internal memory 314 of FIG. 3, as non-limiting examples. The CMC 204 provides a mask table 402, in which a plurality of masks (not shown) and associated prefixes (not shown) are stored. The CMC 204 further comprises a pattern identification circuit 404 and an output generation circuit 406. The pattern identification circuit 404 is configured to receive an uncompressed input block 408 comprising multiple input words (not shown), apply masks from the mask table 402 to the input words to generate patterns, identify a most frequently occurring pattern for each mask, and compress input words into a prefix corresponding to the mask and an uncompressed data portion. The output generation circuit 406 then assembles the compressed data into a compressed output block 410. The structure and contents of the mask table 402 are described in greater detail below with respect to FIG. 5, and exemplary operations performed by the pattern identification circuit 404 and the output generation circuit 406 for performing lossless compression of the uncompressed input block 408 are discussed in greater detail below with respect to FIGS. 6A-6E.

Figure 5:
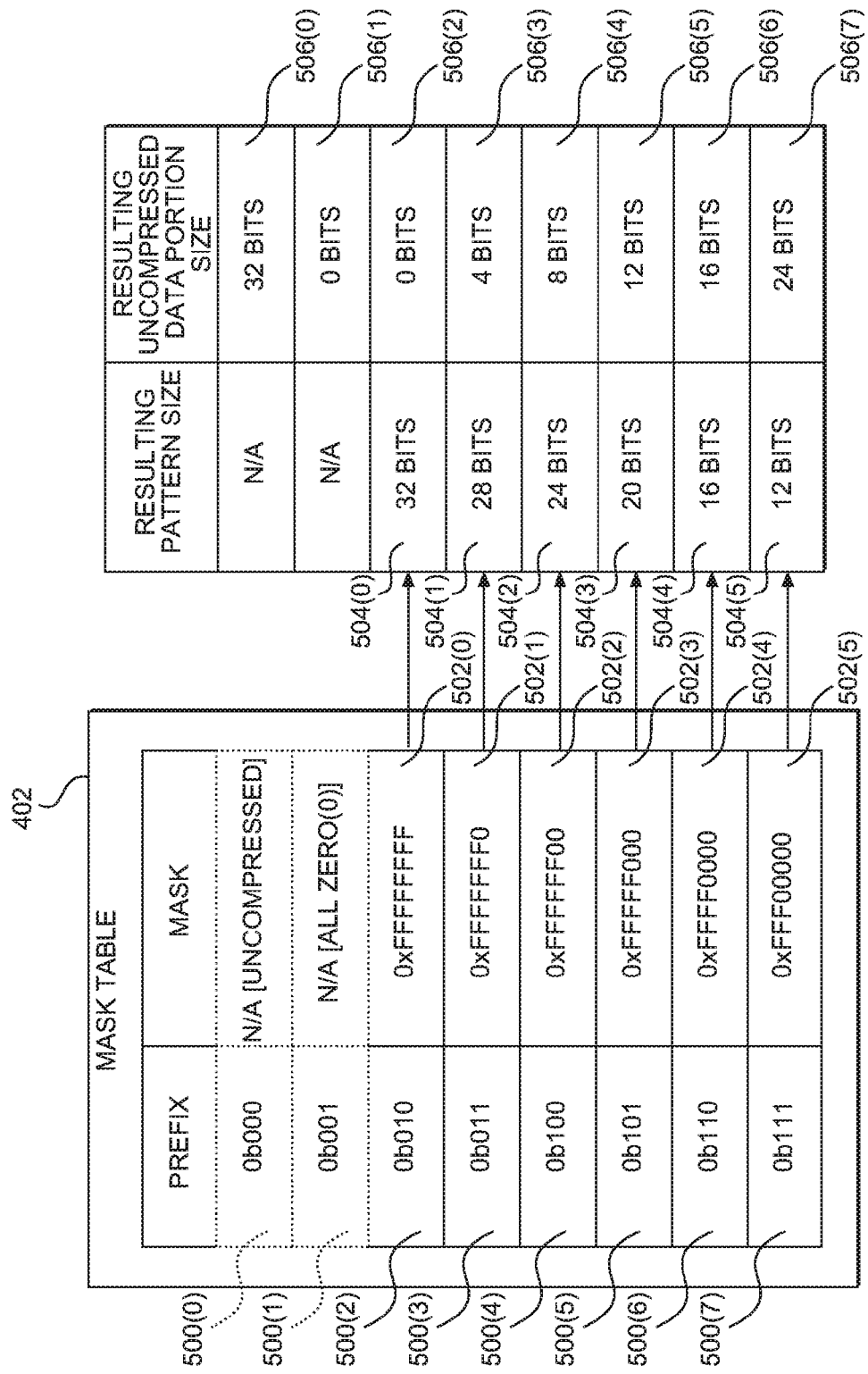
FIG. 5 is a diagram illustrating an exemplary mask table that may be used by the CMC of FIGS. 2, 3, and 4 for carrying out lossless compression of small data blocks.

FIG. 5 illustrates an exemplary aspect of the mask table 402 of FIG. 4 that may be used by the CMC 204 of FIGS. 2, 3, and 4 for carrying out lossless compression of small data blocks. For the sake of illustration, it is assumed in the example of FIG. 5 that the mask table 402 is used to encode 32-bit input words. As seen in FIG. 5, the mask table 402 includes a plurality of prefixes 500(0)-500(7), each of which comprises a three (3) bit value ranging from zero (0) to seven (7). It is to be understood that, in some aspects, each of the prefixes 500(0)-500(7) may comprise more or fewer bits than shown in FIG. 5, resulting in more or fewer prefixes 500(0)-500(7) than the eight (8) shown in FIG. 5.

The mask table 402 further includes a plurality of masks 502(0)-502(5), each of which is associated with the prefixes 500(2)-500(7), respectively, and each of which comprises a 32-bit mask value. As seen in FIG. 5, the masks 502(0)-502(5) are selected such that successive ones of the masks 502(0)-502(5) mask off increasingly larger portions of an input word to which the masks 502(0)-502(5) are applied using a logical AND operation. For example, the mask 502(1), which has a hexadecimal value of 0xFFFFFFF0, would mask off the lower four (4) bits of an input word to which the mask 502(1) is applied, while the mask 502(2) having a hexadecimal value of 0xFFFFFF00 would mask off the lower eight (8) bits of the input word, and so forth. As used herein, the term "uncompressed data portion" refers to the lower bits of the input word that are masked off by a given mask 502(0)-502(5), while the term "pattern" refers to the remaining upper bits left on by the mask 502(0)-502(5). Thus, if the mask 502(4) having a hexadecimal value of 0xFFFF0000 were applied to an input word having a hexadecimal value of 0x1234ABCD, the resulting pattern for the input word would be the value 0x1234, while the uncompressed data portion for the input word would be the value 0xABCD.

Note that in the aspect shown in FIG. 5, the prefixes 500(0) and 500(1) are not associated with masks. Instead, the prefix 500(0) is used to indicate that an input word to which it is assigned is uncompressed (as if a mask 502 having a hexadecimal value of 0x00000000 were applied to the input word). The prefix 500(1) is used to indicate that an input word to which it is assigned has a value of zero (0).

FIG. 5 further illustrates resulting pattern sizes 504(0)-504(5) and resulting uncompressed data portion sizes 506(0)-506(7) that result from the use of the prefixes 500(0)-500(7) and the masks 502(0)-502(5) of the mask table 402. The prefix 500(0), which indicates an uncompressed input word, is associated with a resulting uncompressed data portion size 506(0) of 32 bits (i.e., the entire input word). Conversely, the prefix 500(1) indicating an input word having a zero (0) value is associated with a resulting uncompressed data portion size 506(1) of zero (0) bits (i.e., only the prefix 500(1) needs to be stored in order to compress the input word). As seen in FIG. 5, the resulting pattern size 504(0) generated by the mask 502(0) is 32 bits, while the resulting uncompressed data portion size 506(2) generated by the mask 502(0) is zero (0) bits. This is because applying the mask 502(0), which has a hexadecimal value of 0xFFFFFFFF, to an input word results in the entire input word being used as the pattern. Each subsequent mask 502(1)-502(5) shown in FIG. 5 generates a resulting pattern size 504(1)-504(5) that is four (4) bits smaller than the previous resulting pattern size 504(0)-504(4), and a resulting uncompressed data portion size 506(3)-506(7) that is four (4) bits larger than the previous resulting uncompressed data portion size 506(2)-506(6).

It is to be understood that the values of the masks 502(0)-502(5) in some aspects may vary from those shown in FIG. 5, and may be selected based on frequently encountered input word values and/or expected input word values.

According to some aspects, one or more of the masks 502(0)-502(5) may generate a resulting pattern having the same size as that generated by a preceding or following mask 502(0)-502(5). As a non-limiting example, two (2) consecutive masks 502(0)-502(5) may each generate a resulting pattern having a size of 32 bits.

Figure 6B:
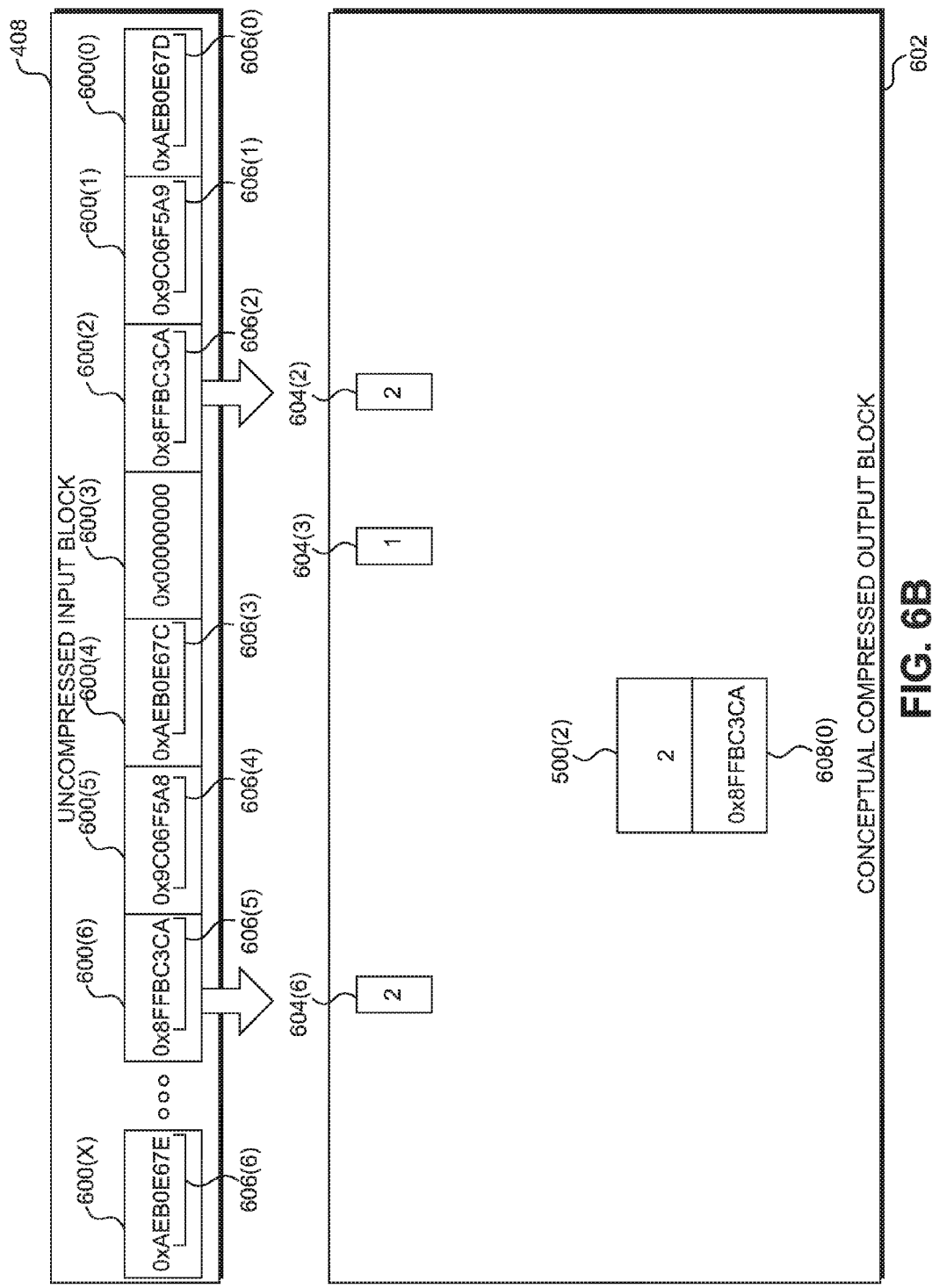

The CMC 204 of FIGS. 2, 3, and 4 employs the prefixes 500(0)-500(7) and the masks 502(0)-502(5) of FIG. 5 to perform lossless compression of input words. In this regard, FIGS. 6A-6E are provided to illustrate exemplary operations of the pattern identification circuit 404 and the output generation circuit 406 of FIG. 4 for compressing input data words and generating the compressed output block 410. As seen in FIG. 6A, the uncompressed input block 408, which is received by the pattern identification circuit 404, comprises multiple input words 600(0)-600(X). In some aspects, the input words 600(0)-600(X) may comprise 32 input words, each 32 bits in size. For purposes of illustration, FIGS. 6A-6D illustrate the uncompressed input block 408 being processed into a conceptual compressed output block 602, which shows the relationship between the input words 600(0)-600(X) and their compressed forms. The conceptual compressed output block 602 is then reorganized into the actual compressed output block 410, as shown in FIG. 6E. While not shown in FIGS. 6A-6E, this processing and reorganizing may include the use of intermediate storage such as temporary buffers, registers, memory, or the like.

According to some aspects, the pattern identification circuit 404 may first look for any input words 600(0)-600(X) having a value of zero (0). Those input words 600(0)-600(X) are assigned the prefix 500(1) indicating an all-zero (0) value. In the example of FIG. 6A, the pattern identification circuit 404 identifies the input word 600(3) having a value of zero (0, or the hexadecimal value 0x00000000), and associates the input word 600(3) with an assigned prefix 604(3) having a value of 1 (corresponding to the prefix 500(1) of the mask table 402). Because the input word 600(3) has a value of zero (0), it is not necessary to store any information other than the assigned prefix 604(3) to compress the input word 600(3).

Referring now to FIG. 6B, the pattern identification circuit 404 next begins the process of applying each of the masks 502(0)-502(5) of the mask table 402 in turn to the unassigned input words 600(0)-600(2) and 600(4)-600(X). Note that input word 600(3), having already been associated with the assigned prefix 604(3), is excluded from further processing. In FIG. 6B, the pattern identification circuit 404 first applies the mask 502(0) having a value of 0xFFFFFFFF to the unassigned input words 600(0)-600(2) and 600(4)-600(X) to generate a plurality of generated patterns 606(0)-606(6). Because the mask 502(0) has a hexadecimal value of 0xFFFFFFFF, each of the generated patterns 606(0)-606(6) has the same value as the corresponding input word 600(0)-600(2), 600(4)-600(X). Thus, the generated pattern 606(0) has a hexadecimal value of 0xAEB0E67D, the generated pattern 606(1) has a hexadecimal value of 0X9C06F5A9, and so forth.

The pattern identification circuit 404 next determines whether a most frequently occurring pattern exists among the generated patterns 606(0)-606(6). In some aspects, a generated pattern 606(0)-606(6) is not considered to be a most frequently occurring pattern unless it occurs at least twice among the generated patterns 606(0)-606(6). Some aspects may provide that if more than one frequently occurring pattern is identified (i.e., two or more of the generated patterns 606(0)-606(6) occur repeatedly, and occur the same number of times), the pattern identification circuit 404 may select one of the frequently occurring patterns randomly or according to an arbitrary criteria. In the example of FIG. 6B, the pattern identification circuit 404 determines that the most frequently occurring pattern is the hexadecimal value 0x8FFBC3CA, which occurs in the generated patterns 606(2) and 606(5) corresponding to the input words 600(2) and 600(6), respectively. Accordingly, the pattern identification circuit 404 associates the input words 600(2) and 600(6) with assigned prefixes 604(2) and 604(6), each having a value of 2 (corresponding to the prefix 500(2) of the mask table 402). The pattern identification circuit 404 also stores the value of the generated patterns 606(2), 606(5) as a most frequently occurring pattern 608(0) in association with the prefix 500(2).

Figure 6C:
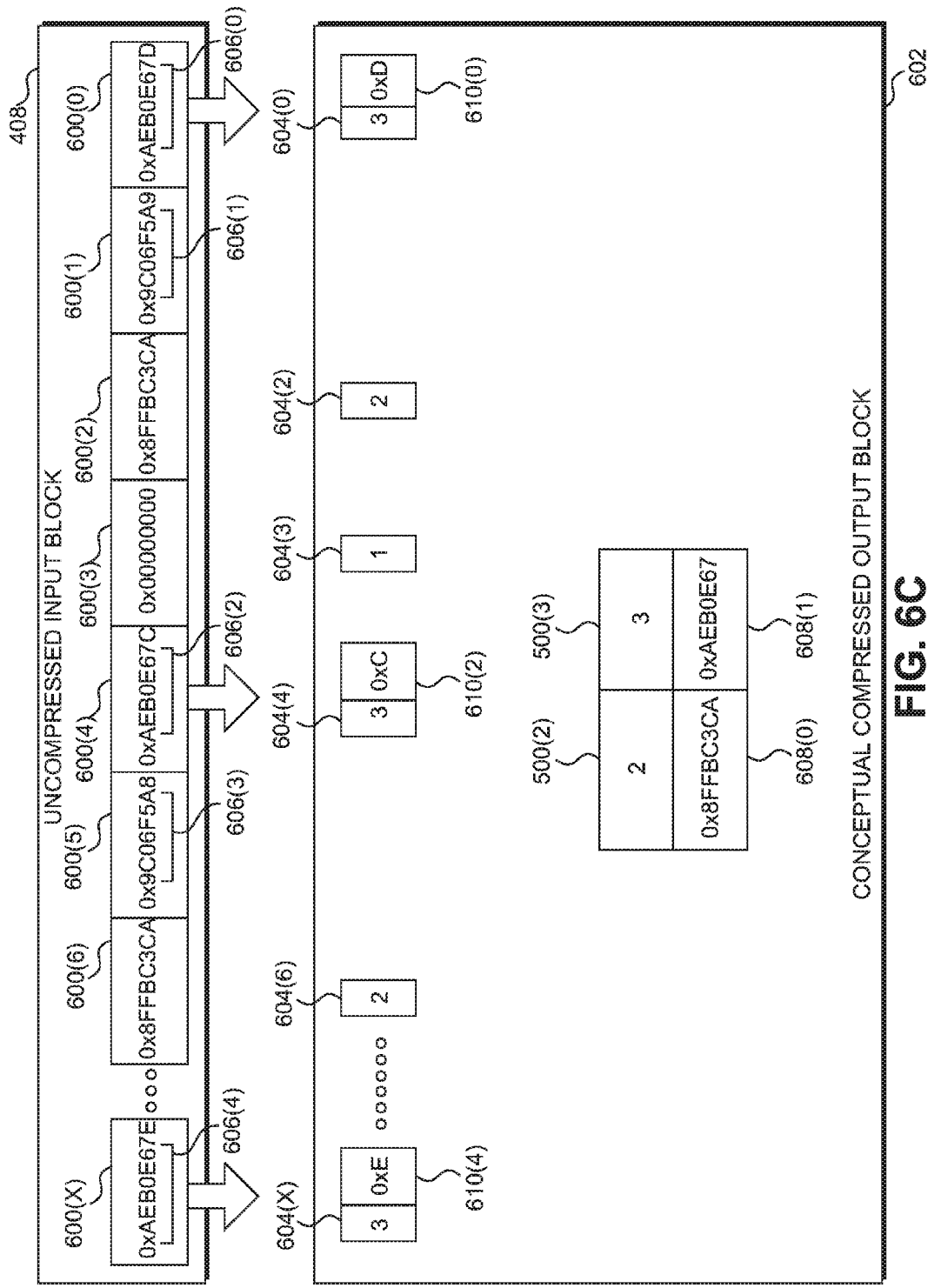

Operations then continue in FIG. 6C, where the pattern identification circuit 404 applies the next mask 502(1) having a hexadecimal value of 0xFFFFFFF0 to the unassigned input words 600(0), 600(1), 600(4), 600(5), and 600(X). The mask 502(1) acts to mask off the lower four (4) bits of each of the input words 600(0), 600(1), 600(4), 600(5), and 600(X), resulting in the generated patterns 606(0)-606(4) having a length of 28 bits each. As a result, the generated pattern 606(0) has a hexadecimal value of 0xAEB0E67, the generated pattern 606(1) has a hexadecimal value of 0x9C06F5A, and so forth.

The pattern identification circuit 404 then determines whether a most frequently occurring pattern exists among the generated patterns 606(0)-606(4). In the example of FIG. 6C, the generated patterns 606(0), 606(2), and 606(4) have a hexadecimal value of 0xAEB0E67, while the generated patterns 606(1) and 606(3) both have a hexadecimal value of 0x9C06F5A. Thus, the pattern identification circuit 404 identifies the generated patterns 606(0), 606(2), and 606(4), corresponding to the input words 600(0), 600(4), and 600(X), as the most frequently occurring pattern. As seen in FIG. 6C, the pattern identification circuit 404 associates the input words 600(0), 600(4), and 600(X) with assigned prefixes 604(0), 604(4), and 604(X), respectively, with each of the assigned prefixes 604(0), 604(4), and 604(X) having a value of 3 (corresponding to the prefix 500(3) of the mask table 402). The portions of the input words 600(0), 600(4), and 600(X) that were masked off by the mask 502(1) when generating the generated patterns 606(0)-606(4) are also stored with the assigned prefixes 604(0), 604(4), and 604(X) as uncompressed data portions 610(0), 610(2), and 610(4). For example, the uncompressed data portion 610(0) has a hexadecimal value of 0xD, corresponding to the value of the lower four (4) bits of the hexadecimal value 0xAEB0E67D of the input word 600(0) that were masked off by the mask 502(1). Finally, the pattern identification circuit 404 stores the value of the generated patterns 606(0), 606(2), 606(4) as a most frequently occurring pattern 608(1) in association with the prefix 500(3).

Figure 6D:
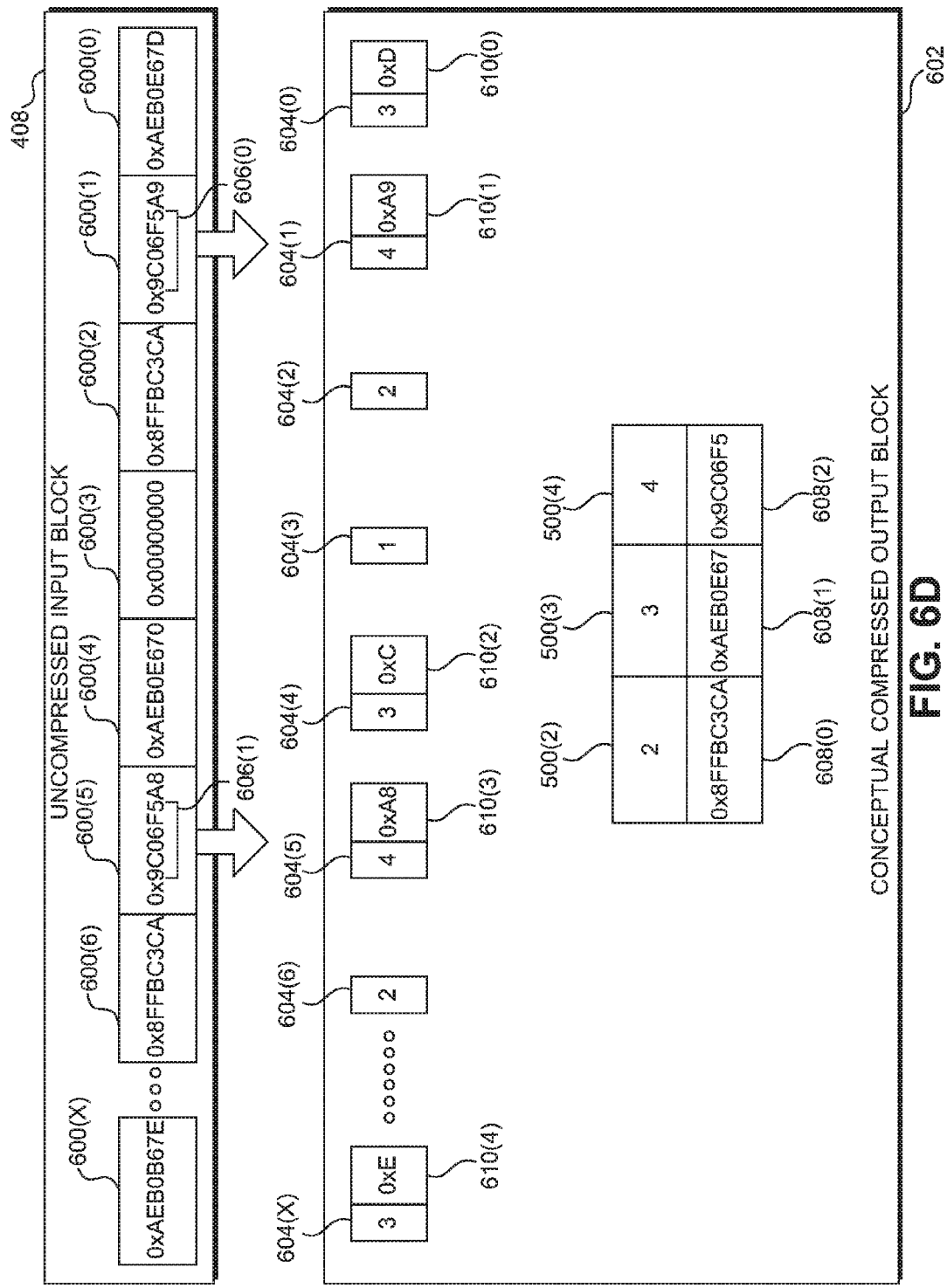

Referring now to FIG. 6D, the pattern identification circuit 404 continues by applying the mask 502(2) having a hexadecimal value of 0xFFFFFF00 to the remaining unassigned input words 600(1) and 600(5). Generated patterns 606(0) and 606(1) are produced by using the mask 502(2) to mask off the lower eight (8) bits of each of the input words 600(1), 600(5) to produce the hexadecimal value 0x9C06F5. As the generated patterns 606(0) and 606(1) corresponding to the input words 600(1), 600(5) have the same value, the pattern identification circuit 404 identifies the generated patterns 606(0), 606(1) as the most frequently occurring pattern. Consequently, the pattern identification circuit 404 associates the input words 600(1) and 600(5) with assigned prefixes 604(1) and 604(5), respectively, with each of the assigned prefixes 604(1) and 604(5) having a value of 4 (corresponding to the prefix 500(4) of the mask table 402). The eight (8)-bit portions of the input words 600(1) and 600(5) that were masked off by the mask 502(2) when generating the generated patterns 606(0), 606(1) are also stored with the assigned prefixes 604(1) and 604(5) as uncompressed data portions 610(1) and 610(3). In the example of FIG. 6D, the uncompressed data portion 610(1) has a hexadecimal value of 0xA9, corresponding to the value of the lower four (8) bits of the hexadecimal value 0x9C06F5A9 of the input word 600(1) that were masked off by the mask 502(2). Likewise, the uncompressed data portion 610(3) has a hexadecimal value of 0xA8, corresponding to the value of the lower four (8) bits of the hexadecimal value 0x9C06F5A8 of the input word 600(5). The pattern identification circuit 404 additionally stores the value of the generated patterns 606(0), 606(1) as a most frequently occurring pattern 608(2) in association with the prefix 500(4).

The pattern identification circuit 404 continues processing in this manner by applying the remaining masks 502(3)-502(5) in turn to any unassigned input words 600(0)-600(X). For each of the masks 502(3)-502(5), the pattern identification circuit 404 attempts to identify a most frequently occurring pattern (if any). If successful, the pattern identification circuit 404 stores an assigned prefix 604(0)-604(X) and an uncompressed data portion 610 for each input word 600(0)-600(X) corresponding to the most frequently occurring pattern, and also stores the most frequently occurring pattern in association with the assigned prefix 604(0)-604(X).

In some aspects, after all of the masks 502(0)-502(5) have been processed, the pattern identification circuit 404 may determine whether any of the input words 600(0)-600(X) remain unassigned to a prefix 500(1)-500(7). If so, the pattern identification circuit 404 assigns the prefix 500(0), indicating an uncompressed word, to those unassigned input words 600(0)-600(X). The pattern identification circuit 404 also stores the entire value of each unassigned input word 600(0)-600(X) as the uncompressed data portion 610 of the input word 600(0)-600(X) in association with the prefix 500(0).

During the operations illustrated in FIGS. 6A-6D, the pattern identification circuit 404 may output some or all of the data shown in the conceptual compressed output block 602 to the output generation circuit 406. After all of the masks 502(0)-502(5) and the input words 600(0)-600(X) have been processed (or in parallel with such processing), the output generation circuit 406 organizes the generated data into the compressed output block 410. In this regard, FIG. 6E illustrates an exemplary format for the compressed output block 410. In FIG. 6E, the assigned prefixes 604(0)-604(X), each corresponding to one of the input words 600(0)-600(X), are located first in the compressed output block 410 (starting from the rightmost side and proceeding left). In some aspects, the compressed output block 410 next may include a set of flag indicators 612(0)-612(5), each corresponding to one of the prefixes 500(2)-500(7). Each of the flag indicators 612(0)-612(5) is set by the output generation circuit 406 to indicate whether the most frequently occurring pattern 608(0)-608(2) generated using the prefix 500(2)-500(7) corresponding to the flag indicator 612(0)-612(5) is present in the compressed output block 410. For instance, if a particular most frequently occurring pattern 608(0)-608(2) were all zeroes (0), a higher level of compression may be achieved by setting the corresponding flag indicator 612(0)-612(5) to zero (0) and omitting all-zero most frequently occurring patterns 608(0)-608(2) from the compressed output block 410.

Next in the compressed output block 410 are the most frequently occurring patterns 608(0)-608(2) identified by the pattern identification circuit 404 to be included in the compressed output block 410. These are followed by the uncompressed data portions 610(0)-610(4). Note that, while each of the input words 600(0)-600(X) has a corresponding assigned prefix 604(0)-604(X), some of input words 600(0)-600(X) may not have corresponding uncompressed data portions 610(0)-610(4). For instance, input words 600(0)-600(X) that have a value of zero (0) or that are assigned to the mask 502(0) do not require additional uncompressed data to be stored within the compressed output block 410.

In some aspects, after generating the compressed output block 410, the output generation circuit 406 may compare a size of the compressed output block 410 with a specified threshold to determine whether compression of the input words 600(0)-600(X) is to be considered successful. For example, in processing a set of input words 600(0)-600(X) having a total size of 1024 bits, the output generation circuit 406 may compare the size of the compressed output block 410 with a specified threshold of 513 bits. If the compressed output block 410 is smaller than the specified threshold, the output generation circuit 406 may determine that compression was successful, and may store the compressed output block 410 in the memory array 400. However, if the compressed output block 410 is not smaller than the specified threshold, the output generation circuit 406 may determine that compression was not successful, and thus may store the original uncompressed input words 600(0)-600(X) in the memory array 400.

Figure 7:
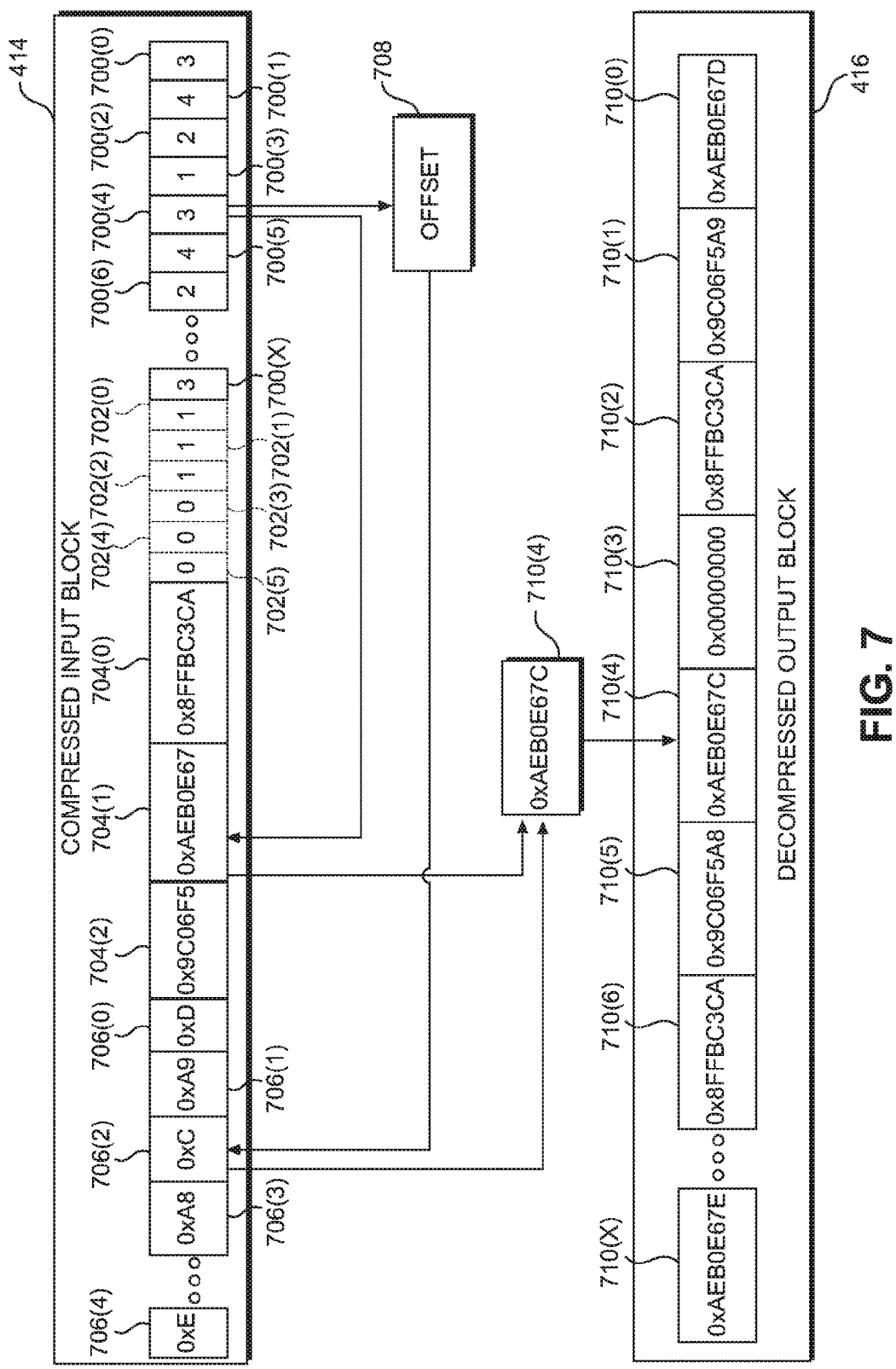
FIG. 7 is a diagram illustrating exemplary operations of the CMC of FIGS. 2, 3, and 4 for decompressing a compressed input block into a decompressed output block.

As discussed above, some aspects of the CMC 204 may also provide a decompression circuit 412 for receiving a compressed input block 414 and generating a decompressed output block 416. In this regard, FIG. 7 is provided to illustrate exemplary operations for performing decompression. For the sake of clarity, it is assumed that the decompression circuit 412 receives as input a compressed input block 414 having the same format and content as the compressed output block 410 of FIG. 6E. Thus, the compressed input block 414 includes a set of prefixes 700(0)-700(X), a set of flags 702(0)-702(5), a set of patterns 704(0)-704(2), and a set of uncompressed data portions 706(0)-706(4).

To decompress the compressed input block 414, the decompression circuit 412 processes each of the prefixes 700(0)-700(X) in turn to generate decompressed output words 710(0)-710(X). For prefixes 700(0)-700(X) having a value of one (1) corresponding to the prefix 500(1) of FIG. 5 indicating a value of zero (0), the decompression circuit 412 can generate the corresponding decompressed output word 710(0)-710(X) without further computation. Otherwise, for each prefix 700(0)-700(X), the decompression circuit 412 generates an offset 708 that indicates where the corresponding uncompressed data portion 706(0)-706(4) is stored within the compressed input block 414. In some aspects, the offset 708 is generated based on determining a size of the patterns 704(0)-704(2) and a size of previously processed uncompressed data portions 706(0)-706(4) for previously processed prefixes 700(0)-700(X).

In the example of FIG. 7, the offset 708 is generated for the prefix 700(4), indicating a location of the uncompressed data portion 706(2) having a hexadecimal value of 0xC. The pattern 704(1), having a hexadecimal value of 0xAEB0E67, is also retrieved for the prefix 700(4). These are combined to generate the decompressed output word 710(4) having a hexadecimal value of 0xAEB0E67C. Similar processing is performed for the other prefixes 700(0)-700(X), resulting in the decompressed output block 416 having the same value as the uncompressed input block 408 of FIGS. 6A-6D.

Figure 8A:
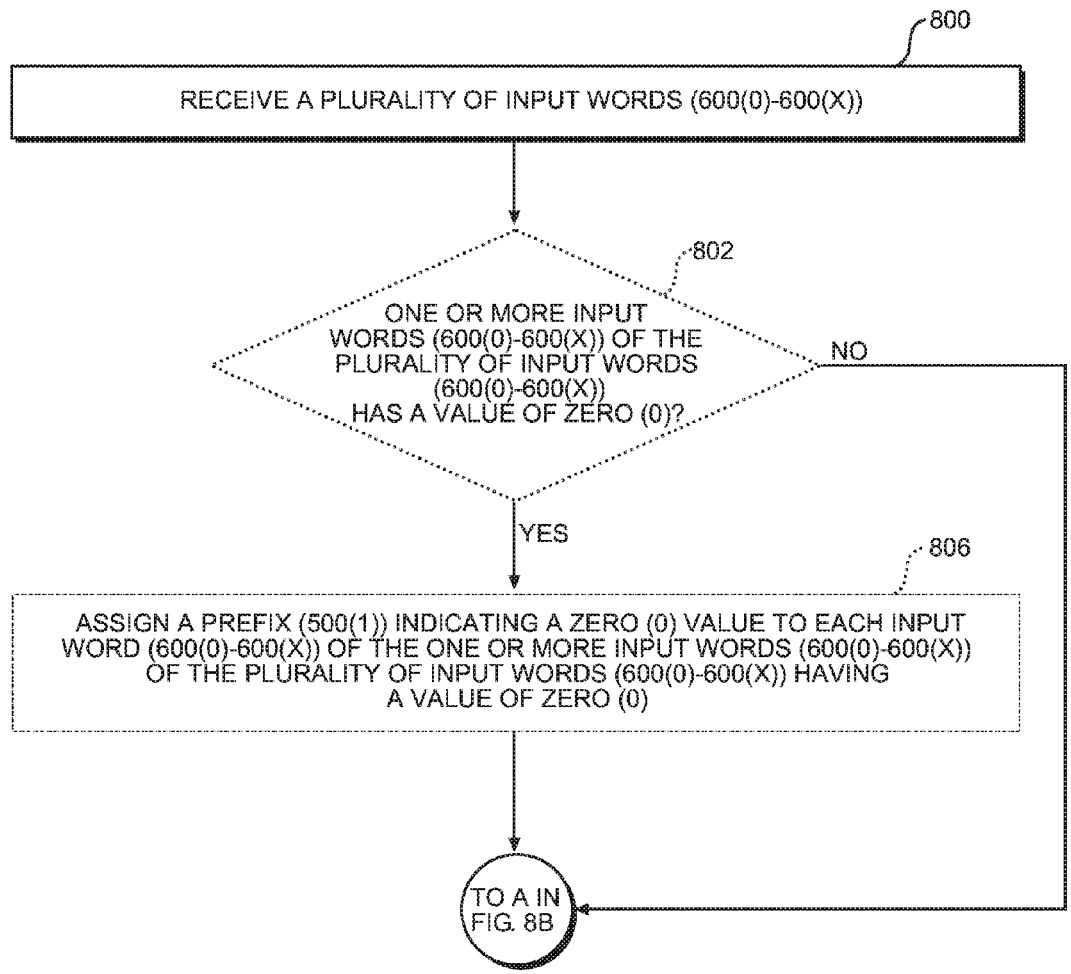
FIGS. 8A-8D are flowcharts illustrating exemplary operations of the CMC of FIGS. 2, 3, and 4 for performing lossless compression of small data blocks.

To illustrate exemplary operations of the CMC 204 of FIGS. 2, 3, and 4 for performing lossless compression of small data blocks, FIGS. 8A-8D are provided. Elements of FIGS. 4, 5, and 6A-6E are referenced in describing FIGS. 8A-8D for purposes of clarity. In FIG. 8A, processing begins with the pattern identification circuit 404 of the CMC 204 receiving the plurality of input words 600(0)-600(X) (block 800). In this regard, the pattern identification circuit 404 may be referred to herein as "a means for receiving a plurality of input words." In some aspects, the plurality of input words 600(0)-600(X) may comprise 32 input words 600(0)-600(X), each 32 bits in size.

In some aspects, the pattern identification circuit 404 next may determine whether one or more input words 600(0)-600(X) of the plurality of input words 600(0)-600(X) has a value of zero (0) (block 802). If none of the plurality of input words 600(0)-600(X) has a value of zero (0), processing resumes at block 804 of FIG. 8B. However, if the pattern identification circuit 404 determines at decision block 802 that one or more input words 600(0)-600(X) of the plurality of input words 600(0)-600(X) has a value of zero (0), the pattern identification circuit 404 assigns a prefix 500(1) indicating a zero (0) value to each input word 600(0)-600(X) of the one or more input words 600(0)-600(X) of the plurality of input words 600(0)-600(X) having a value of zero (0) (block 806). Processing then continues at block 804 of FIG. 8B.

Figure 8B:
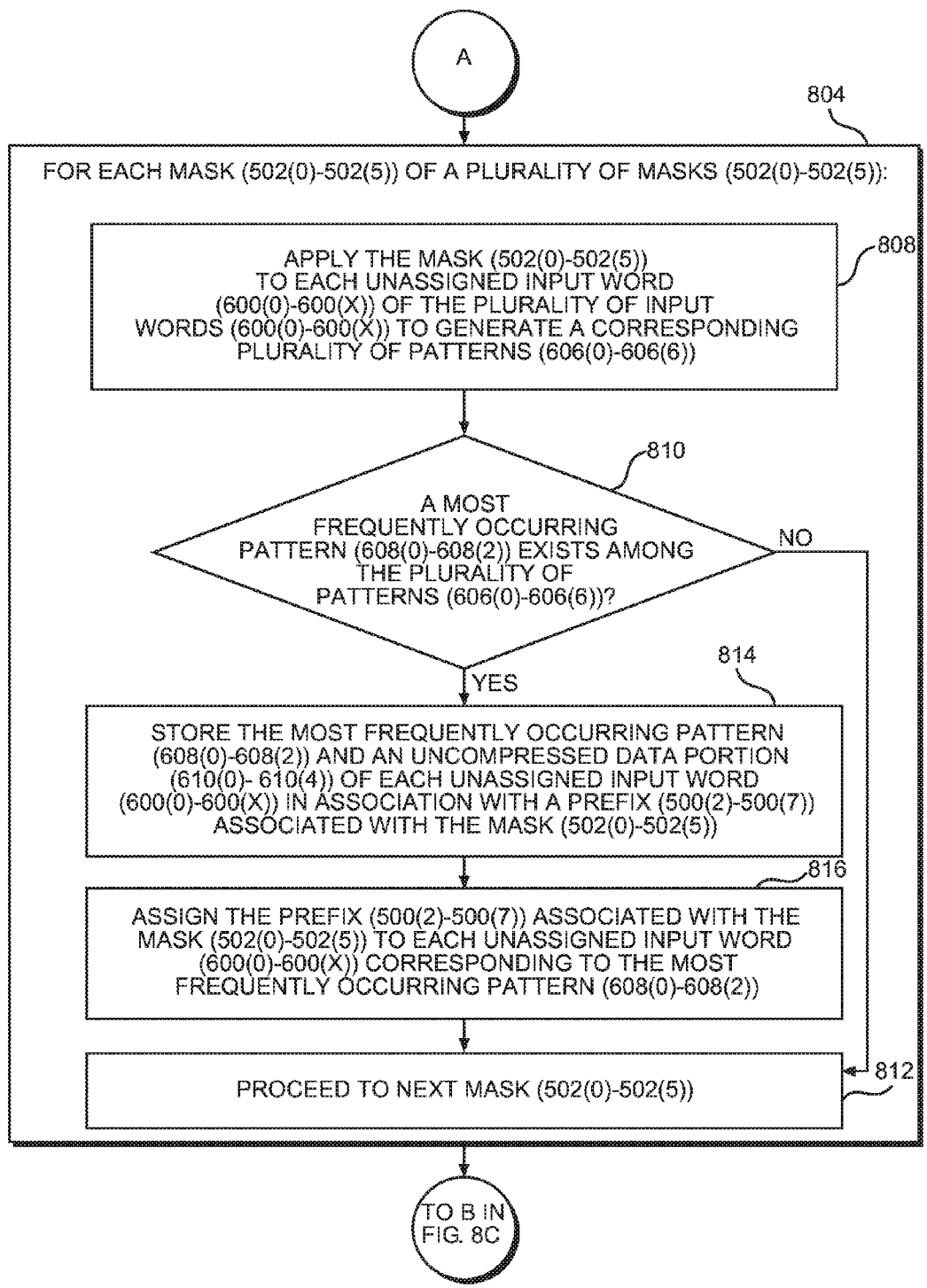

Referring now to FIG. 8B, the pattern identification circuit 404 performs a series of operations for each mask 502(0)-502(5) of the plurality of masks 502(0)-502(5) (block 804). The pattern identification circuit 404 first applies the mask 502(0)-502(5) to each unassigned input word 600(0)-600(X) of the plurality of input words 600(0)-600(X) to generate a corresponding plurality of patterns 606(0)-606(6) (block 808). Accordingly, the pattern identification circuit 404 may be referred to herein as "a means, for each mask of a plurality of masks, for applying the mask to each unassigned input word of the plurality of input words to generate a corresponding plurality of patterns." The pattern identification circuit 404 then determines whether a most frequently occurring pattern 608(0)-608(2) exists among the plurality of patterns 606(0)-606(6) (block 810). The pattern identification circuit 404 thus may be referred to herein as "a means for determining whether a most frequently occurring pattern exists among the plurality of patterns." If no most frequently occurring pattern 608(0)-608(2) exists (e.g., none of the generated patterns 606(0)-606(6) occur at least twice, in some aspects), processing resumes at block 812.

However, if the pattern identification circuit 404 determines at decision block 810 that a most frequently occurring pattern 608(0)-608(2) exists, the pattern identification circuit 404 stores the most frequently occurring pattern 608(0)-608(2) and an uncompressed data portion 601(0)-601(4) of each unassigned input word 600(0)-600(X) in association with the prefix 500(2)-500(7) associated with the mask 502(0)-502(5) (block 814). In this regard, the pattern identification circuit 404 may be referred to herein as "a means for storing the most frequently occurring pattern and an uncompressed data portion of each unassigned input word in association with a prefix associated with the mask, responsive to determining that a most frequently occurring pattern exists among the plurality of patterns." The pattern identification circuit 404 then assigns the prefix 500(2)-500(7) associated with the mask 502(0)-502(5) to each unassigned input word 600(0)-600(X) corresponding to the most frequently occurring pattern 608(0)-608(2) (block 816). Accordingly, the pattern identification circuit 404 may be referred to herein as "a means for assigning the prefix associated with the mask to each unassigned input word corresponding to the most frequently occurring pattern, responsive to determining that a most frequently occurring pattern exists among the plurality of patterns." The pattern identification circuit 404 then proceeds to the next mask 502(0)-502(5) for processing (block 812). After all of the masks 502(0)-502(5) have been processed by the pattern identification circuit 404, processing resumes at block 818 of FIG. 8C.

Figure 8C:
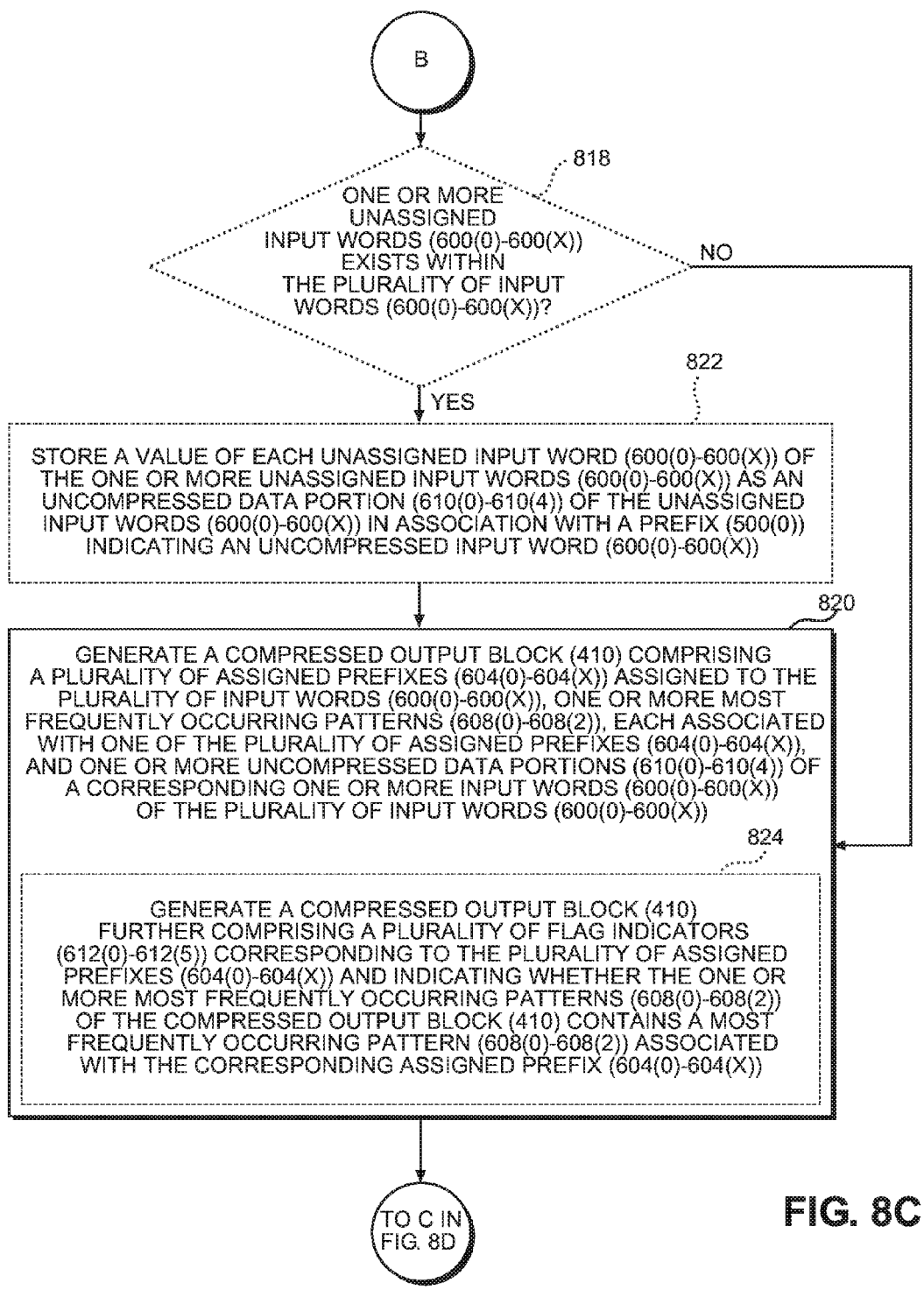

Turning now to FIG. 8C, some aspects of the pattern identification circuit 404 may determine whether one or more unassigned input words 600(0)-600(X) (i.e., input words 600(0)-600(X) that were not assigned the prefix 500(1) in block 806 of FIG. 8A or one of the prefixes 500(2)-500(7) in block 804 of FIG. 8B) exists within the plurality of input words 600(0)-600(X) (block 818). If no unassigned input words 600(0)-600(X) exist, processing resumes at block 820. However, if the pattern identification circuit 404 determines at decision block 818 that one or more unassigned input words 600(0)-600(X) exists within the plurality of input words 600(0)-600(X), the pattern identification circuit 404 stores a value of each unassigned input word 600(0)-600(X) of the one or more unassigned input words 600(0)-600(X) as an uncompressed data portion 610(0)-610(4) of the unassigned input words 600(0)-600(X) in association with a prefix 500(0) indicating an uncompressed input word 600(0)-600(X) (block 822).

The output generation circuit 406 of the CMC 204 then generates a compressed output block 410 comprising a plurality of assigned prefixes 604(0)-604(X) assigned to the plurality of input words 600(0)-600(X), one or more most frequently occurring patterns 608(0)-608(2), each associated with one of the plurality of assigned prefixes 604(0)-604(X), and one or more uncompressed data portions 610(0)-610(4) of a corresponding one or more input words 600(0)-600(X) of the plurality of input words 600(0)-600(X) (block 820). The output generation circuit 406 thus may be referred to herein as "a means for generating a compressed output block comprising: a plurality of assigned prefixes assigned to the plurality of input words; one or more most frequently occurring patterns, each associated with one of the plurality of assigned prefixes; and one or more uncompressed data portions of a corresponding one or more input words of the plurality of input words." In some aspects, the operations of block 820 for generating the compressed output block 410 may include generating the compressed output block 410 to include a plurality of flag indicators 612(0)-612(5) corresponding to the plurality of assigned prefixes 604(0)-604(X) and indicating whether the one or more most frequently occurring patterns 608(0)-608(2) of the compressed output block 410 contains a most frequently occurring pattern 608(0)-608(2) associated with the corresponding assigned prefix 604(0)-604(X) (block 824). Processing then resumes at block 826 of FIG. 8D.

Figure 8D:
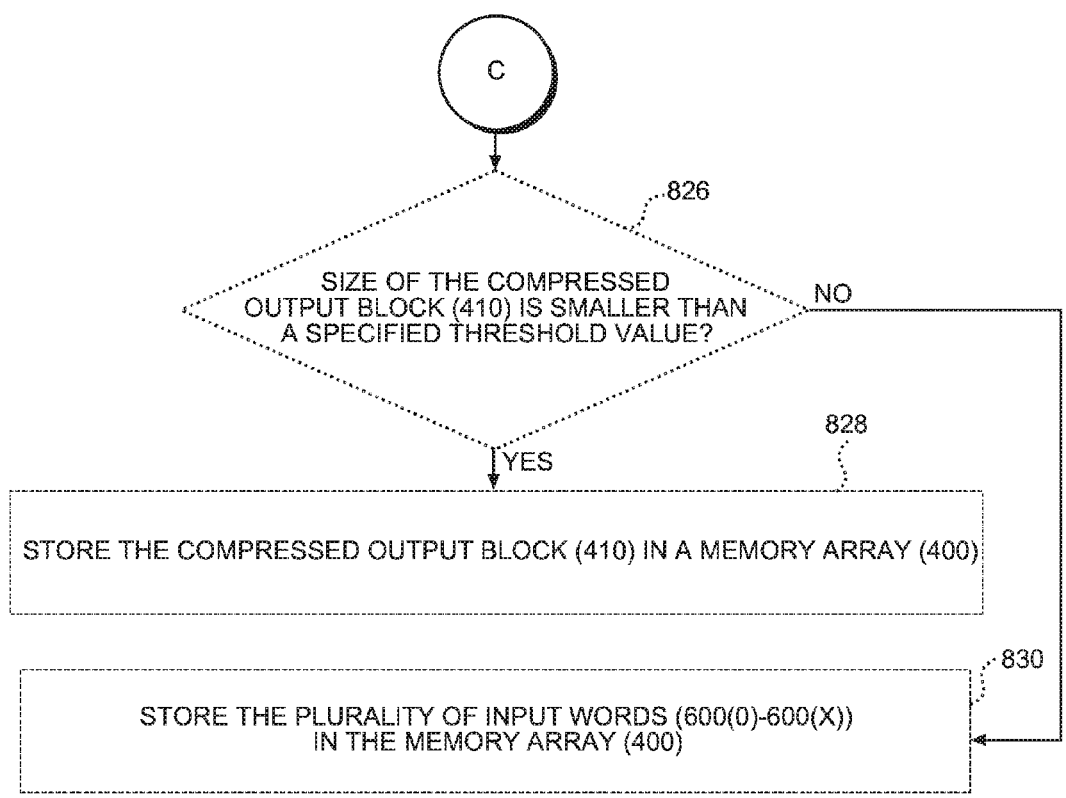

As seen in FIG. 8D, some aspects of the output generation circuit 406 may determine whether a size of the compressed output block 410 is smaller than a specified threshold value (block 826). As a non-limiting example, if the total size of the input words 600(0)-600(X) is 1024 bits, the output generation circuit 406 may determine whether the compressed output block 410 is smaller than a specified threshold value of 513 bits. If the output generation circuit 406 determines at decision block 826 that the size of the compressed output block 410 is smaller than the specified threshold value, the output generation circuit 406 may store the compressed output block 410 in the memory array 400 (block 828). However, if the size of the compressed output block 410 is determined at decision block 826 to not be smaller than the specified threshold value, the output generation circuit 406 may store the plurality of input words 600(0)-600(X) (i.e., the original uncompressed input data) in the memory array 400 (block 830).

Figure 9:
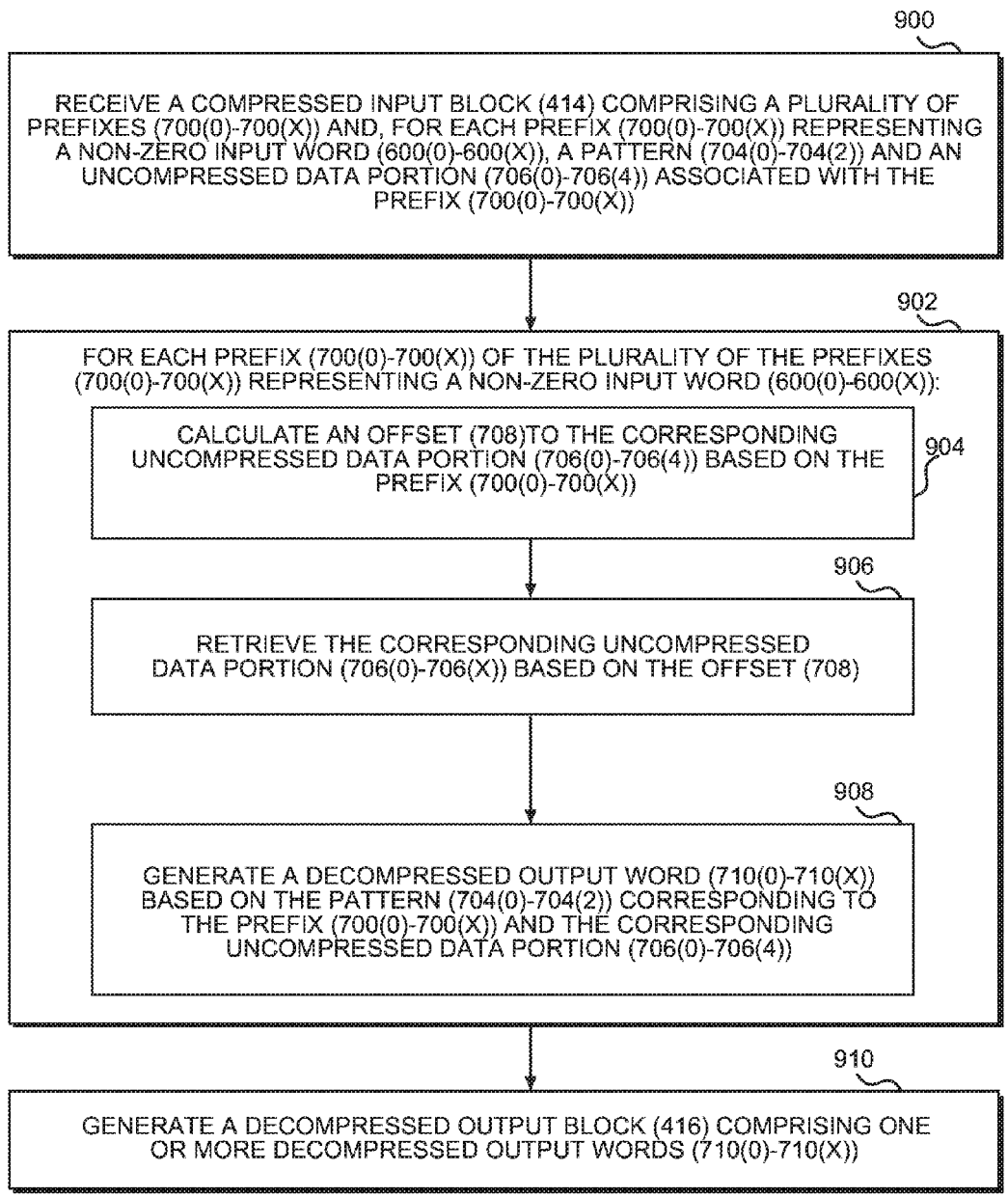
FIG. 9 is a flowchart illustrating exemplary operations of the CMC of FIGS. 2, 3, and 4 for decompressing a compressed input block into a decompressed output block.

As discussed above, some aspects of the CMC 204 may also provide the decompression circuit 412 for decompressing the compressed input block 414 into the decompressed output block 416. In this regard, FIG. 9 illustrates exemplary operations of the CMC 204 of FIGS. 2, 3, and 4 for performing decompression according to some aspects. For the sake of clarity, elements of FIGS. 4 and 7 are referenced in describing FIG. 9. Operations in FIG. 9 begin with the decompression circuit 412 receiving a compressed input block 414 comprising a plurality of prefixes 700(0)-700(X) and, for each prefix 700(0)-700(X) representing a non-zero input word 600(0)-600(X), a pattern 704(0)-704(2) and an uncompressed data portion 706(0)-706(4) associated with the prefix 700(0)-700(X) (block 900). The decompression circuit 412 then performs a series of operations for each prefix 700(0)-700(X) of the plurality of prefixes 700(0)-700(X) representing a non-zero input word 600(0)-600(X) (block 902). The decompression circuit 412 first calculates an offset 708 to the corresponding uncompressed data portion 706(0)-706(4) based on the prefix 700(0)-700(X) (block 904). The decompression circuit 412 then retrieves the corresponding uncompressed data portion 706(0)-706(4) based on the offset 708 (block 906). The decompression circuit 412 generates a decompressed output word 710(0)-710(X) based on the pattern 704(0)-704(2) corresponding to the prefix 700(0)-700(X) and the corresponding uncompressed data portion 706(0)-706(4) (block 908). The decompression circuit 412 then generates a decompressed output block 416 comprising the one or more decompressed output words 710(0)-710(X) (block 910).

Providing efficient lossless compression for small data blocks in processor-based systems according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a server, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

In this regard, FIG. 10 illustrates an example of a processor-based system 1000 that can employ the CMC 204 illustrated in FIGS. 2, 3, and 4. The processor-based system 1000 includes one or more CPUs 1002, each including one or more processors 1004. The CPU(s) 1002 may have cache memory 1006 coupled to the processor(s) 1004 for rapid access to temporarily stored data. The CPU(s) 1002 is coupled to a system bus 1008 and can intercouple master and slave devices included in the processor-based system 1000. As is well known, the CPU(s) 1002 communicates with these other devices by exchanging address, control, and data information over the system bus 1008. For example, the CPU(s) 1002 can communicate bus transaction requests to the CMC 204 as an example of a slave device.

Other master and slave devices can be connected to the system bus 1008. As illustrated in FIG. 10, these devices can include a memory system 1012, one or more input devices 1014, one or more output devices 1016, one or more network interface devices 1018, and one or more display controllers 1020, as examples. The input device(s) 1014 can include any type of input device, including but not limited to input keys, switches, voice processors, etc. The output device(s) 1016 can include any type of output device, including, but not limited to, audio, video, other visual indicators, etc. The network interface device(s) 1018 can be any devices configured to allow exchange of data to and from a network 1022. The network 1022 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1018 can be configured to support any type of communications protocol desired. The memory system 1012 can include one or more memory units 1024(0)-1024(N).

The CPU(s) 1002 may also be configured to access the display controller(s) 1020 over the system bus 1008 to control information sent to one or more displays 1026. The display controller(s) 1020 sends information to the display(s) 1026 to be displayed via one or more video processors 1028, which process the information to be displayed into a format suitable for the display(s) 1026. The display(s) 1026 can include any type of display, including, but not limited to, a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master devices and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A compressed memory controller (CMC), comprising:
    a mask table providing a plurality of masks and an associated plurality of prefixes;
    a pattern identification circuit configured to:
        receive a plurality of input words;
        for each mask of the plurality of masks of the mask table:
            apply the mask to each unassigned input word of the plurality of input words to generate a corresponding plurality of patterns;
            determine whether a most frequently occurring pattern exists among the plurality of patterns; and
            responsive to determining that a most frequently occurring pattern exists among the plurality of patterns:
                output the most frequently occurring pattern and an uncompressed data portion of each unassigned input word to an output generation circuit in association with a prefix of the plurality of prefixes associated with the mask; and
                assign the prefix associated with the mask to each unassigned input word corresponding to the most frequently occurring pattern; and
        output a plurality of assigned prefixes assigned to the plurality of input words to the output generation circuit;
    the output generation circuit configured to generate a compressed output block comprising:
        the plurality of assigned prefixes assigned to the plurality of input words;
        one or more most frequently occurring patterns, each associated with one of the plurality of assigned prefixes; and
        one or more uncompressed data portions of a corresponding one or more input words of the plurality of input words.

2. The CMC of claim 1, wherein the pattern identification circuit is further configured to:
    determine whether one or more input words of the plurality of input words has a value of zero (0); and
    responsive to determining that one or more input words of the plurality of input words has a value of zero (0), assign a prefix of the plurality of prefixes indicating a zero (0) value to each input word of the one or more input words of the plurality of input words having the value of zero (0).

3. The CMC of claim 1, wherein the pattern identification circuit is further configured to:
    determine whether one or more unassigned input words exists within the plurality of input words; and
    responsive to determining that one or more unassigned input words exists within the plurality of input words, output a value of each unassigned input word of the one or more unassigned input words to the output generation circuit as an uncompressed data portion of the unassigned input word in association with a prefix of the plurality of prefixes indicating an uncompressed input word.

4. The CMC of claim 1, wherein the output generation circuit is configured to generate the compressed output block further comprising a plurality of flag indicators corresponding to the plurality of assigned prefixes and each indicating whether the one or more most frequently occurring patterns of the compressed output block contains a most frequently occurring pattern associated with a corresponding assigned prefix of the plurality of assigned prefixes.

5. The CMC of claim 1, wherein the output generation circuit is further configured to:
    determine whether a size of the compressed output block is smaller than a specified threshold value;
    responsive to determining that a size of the compressed output block is smaller than a specified threshold value, store the compressed output block in a memory array; and
    responsive to determining that a size of the compressed output block is not smaller than a specified threshold value, store the plurality of input words in the memory array.

6. The CMC of claim 1, wherein successive masks of the plurality of masks of the mask table are configured to produce patterns of decreasing size.

7. The CMC of claim 1, wherein the pattern identification circuit is configured to determine whether the most frequently occurring pattern exists among the plurality of patterns by determining that the most frequently occurring pattern occurs at least twice among the plurality of patterns.

8. The CMC of claim 1, wherein:
each of the plurality of prefixes comprises three (3) bits; and
the pattern identification circuit is configured to receive the plurality of input words by receiving 32 input words, each 32 bits in size.

9. The CMC of claim 1, further comprising a decompression circuit configured to:
receive a compressed input block comprising a plurality of prefixes and, for each prefix of the plurality of prefixes representing a non-zero input word, a pattern and an uncompressed data portion associated with the prefix;
for each prefix of the plurality of prefixes representing a non-zero input word:
calculate an offset to the corresponding uncompressed data portion based on the prefix;
retrieve the corresponding uncompressed data portion based on the offset; and
generate a decompressed output word based on the pattern corresponding to the prefix and the corresponding uncompressed data portion; and
generate a decompressed output block comprising one or more decompressed output words.

10. The CMC of claim 1 integrated into an integrated circuit (IC).

11. The CMC of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a server; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

12. A compressed memory controller (CMC), comprising:
a means for receiving a plurality of input words;
a means, for each mask of a plurality of masks, for applying the mask to each unassigned input word of the plurality of input words to generate a corresponding plurality of patterns;
a means for determining whether a most frequently occurring pattern exists among the plurality of patterns;
a means for storing the most frequently occurring pattern and an uncompressed data portion of each unassigned input word in association with a prefix associated with the mask, responsive to determining that a most frequently occurring pattern exists among the plurality of patterns;
a means for assigning the prefix associated with the mask to each unassigned input word corresponding to the most frequently occurring pattern, responsive to determining that a most frequently occurring pattern exists among the plurality of patterns; and
a means for generating a compressed output block comprising:
a plurality of assigned prefixes assigned to the plurality of input words;
one or more most frequently occurring patterns, each associated with one of the plurality of assigned prefixes; and
one or more uncompressed data portions of a corresponding one or more input words of the plurality of input words.

13. A method for providing efficient lossless compression of data blocks, comprising:
receiving a plurality of input words;
for each mask of a plurality of masks:
applying the mask to each unassigned input word of the plurality of input words to generate a corresponding plurality of patterns;
determining whether a most frequently occurring pattern exists among the plurality of patterns; and
responsive to determining that a most frequently occurring pattern exists among the plurality of patterns:
storing the most frequently occurring pattern and an uncompressed data portion of each unassigned input word in association with a prefix associated with the mask; and
assigning the prefix associated with the mask to each unassigned input word corresponding to the most frequently occurring pattern; and
generating a compressed output block comprising:
a plurality of assigned prefixes assigned to the plurality of input words;
one or more most frequently occurring patterns, each associated with one of the plurality of assigned prefixes; and
one or more uncompressed data portions of one or more corresponding input words of the plurality of input words.

14. The method of claim 13, further comprising:
determining whether one or more input words of the plurality of input words has a value of zero (0); and
responsive to determining that one or more input words of the plurality of input words has a value of zero (0), assigning a prefix indicating a zero (0) value to each input word of the one or more input words of the plurality of input words having the value of zero (0).

15. The method of claim 13, further comprising:
prior to generating the compressed output block, determining whether one or more unassigned input words exists within the plurality of input words; and
responsive to determining that one or more unassigned input words exists within the plurality of input words, storing a value of each unassigned input word of the one or more unassigned input words as an uncompressed data portion of the unassigned input word in association with a prefix indicating an uncompressed input word.

16. The method of claim 13, comprising generating the compressed output block further comprising a plurality of flag indicators corresponding to the plurality of assigned prefixes and each indicating whether the one or more most frequently occurring patterns of the compressed output block contains a most frequently occurring pattern associated with a corresponding assigned prefix of the plurality of assigned prefixes.

17. The method of claim 13, further comprising:
determining whether a size of the compressed output block is smaller than a specified threshold value;
responsive to determining that a size of the compressed output block is smaller than a specified threshold value, storing the compressed output block in a memory array; and responsive to determining that a size of the compressed output block is not smaller than a specified threshold value, storing the plurality of input words in the memory array.

18. The method of claim 13, wherein successive masks of the plurality of masks are configured to produce patterns of decreasing size.

19. The method of claim 13, wherein determining whether the most frequently occurring pattern exists among the plurality of patterns comprises determining that the most frequently occurring pattern occurs at least twice among the plurality of patterns.

20. The method of claim 13, wherein:
each of the plurality of prefixes comprises three (3) bits; and
the plurality of input words comprises 32 input words, each 32 bits in size.

21. The method of claim 13, further comprising:
receiving a compressed input block comprising a plurality of prefixes and, for each prefix of the plurality of prefixes representing a non-zero input word, a pattern and an uncompressed data portion associated with the prefix;
for each prefix of the plurality of prefixes representing a non-zero input word:
calculating an offset to the corresponding uncompressed data portion based on the prefix;
retrieving the corresponding uncompressed data portion based on the offset; and
generating a decompressed output word based on the pattern corresponding to the prefix and the corresponding uncompressed data portion; and
generating a decompressed output block comprising one or more decompressed output words.

22. A non-transitory computer-readable medium having stored thereon computer executable instructions which, when executed by a processor, cause the processor to:
receive a plurality of input words;
for each mask of a plurality of masks:
apply the mask to each unassigned input word of the plurality of input words to generate a corresponding plurality of patterns;
determine whether a most frequently occurring pattern exists among the plurality of patterns; and
responsive to determining that a most frequently occurring pattern exists among the plurality of patterns:
store the most frequently occurring pattern and an uncompressed data portion of each unassigned input word in association with a prefix associated with the mask; and
assign the prefix associated with the mask to each unassigned input word corresponding to the most frequently occurring pattern; and
generate a compressed output block comprising:
a plurality of assigned prefixes assigned to the plurality of input words;
one or more most frequently occurring patterns, each associated with one of the plurality of assigned prefixes; and
one or more uncompressed data portions of a corresponding one or more input words of the plurality of input words.

23. The non-transitory computer-readable medium of claim 22 having stored thereon computer executable instructions which, when executed by a processor, further cause the processor to:
determine whether one or more input words of the plurality of input words has a value of zero (0); and
responsive to determining that one or more input words of the plurality of input words has a value of zero (0), assign a prefix indicating a zero (0) value to each input word of the one or more input words of the plurality of input words having the value of zero (0).

24. The non-transitory computer-readable medium of claim 22 having stored thereon computer executable instructions which, when executed by a processor, further cause the processor to:
determine whether one or more unassigned input words exists within the plurality of input words; and
responsive to determining that one or more unassigned input words exists within the plurality of input words, storing a value of each unassigned input word of the one or more unassigned input words as an uncompressed data portion of the unassigned input word in association with a prefix indicating an uncompressed input word.

25. The non-transitory computer-readable medium of claim 22 having stored thereon computer executable instructions which, when executed by a processor, further cause the processor to generate the compressed output block further comprising a plurality of flag indicators corresponding to the plurality of assigned prefixes and each indicating whether the one or more most frequently occurring patterns of the compressed output block contains a most frequently occurring pattern associated with a corresponding assigned prefix of the plurality of assigned prefixes.

26. The non-transitory computer-readable medium of claim 22 having stored thereon computer executable instructions which, when executed by a processor, further cause the processor to:
determine whether a size of the compressed output block is smaller than a specified threshold value;
responsive to determining that a size of the compressed output block is smaller than a specified threshold value, store the compressed output block in a memory array; and
responsive to determining that a size of the compressed output block is not smaller than a specified threshold value, store the plurality of input words in the memory array.

27. The non-transitory computer-readable medium of claim 22 having stored thereon computer executable instructions which, when executed by a processor, further cause the processor to determine whether the most frequently occurring pattern exists among the plurality of patterns by determining that the most frequently occurring pattern occurs at least twice among the plurality of patterns.

28. The non-transitory computer-readable medium of claim 22 having stored thereon computer executable instructions which, when executed by a processor, further cause the processor to:
receive a compressed input block comprising a plurality of prefixes and, for each prefix of the plurality of prefixes representing a non-zero input word, a pattern and an uncompressed data portion associated with the prefix;
for each prefix of the plurality of prefixes representing a non-zero input word:
calculate an offset to the corresponding uncompressed data portion based on the prefix;
retrieve the corresponding uncompressed data portion based on the offset; and generate a decompressed output word based on the pattern corresponding to the prefix and the corresponding uncompressed data portion; and generate a decompressed output block comprising one or more decompressed output words.

* * * * *